United States Patent
Kurokami et al.

(10) Patent No.: US 7,126,053 B2
(45) Date of Patent: Oct. 24, 2006

(54) POWER GENERATION SYSTEM AND POWER GENERATION APPARATUS

(75) Inventors: Seiji Kurokami, Kyoto (JP); Kimitoshi Fukae, Nara (JP); Akiharu Takabayashi, Nara (JP); Nobuyoshi Takehara, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 616 days.

(21) Appl. No.: 10/463,790

(22) Filed: Jun. 18, 2003

(65) Prior Publication Data

US 2003/0234038 A1 Dec. 25, 2003

(30) Foreign Application Priority Data

Jun. 19, 2002 (JP) ............................. 2002-177915
May 23, 2003 (JP) ............................. 2003-145748

(51) Int. Cl.
*H01L 31/05* (2006.01)
*H02M 7/08* (2006.01)

(52) U.S. Cl. ...................... 136/252; 136/256; 136/291; 136/293; 363/70; 363/95

(58) Field of Classification Search ................ 136/252, 136/256, 291, 293; 363/70, 95
See application file for complete search history.

(56) References Cited

U.S. PATENT DOCUMENTS

| | | | |
|---|---|---|---|
| 6,169,678 B1 | 1/2001 | Kondo et al. | 363/71 |
| 6,278,055 B1 * | 8/2001 | Forrest et al. | 136/263 |
| 6,448,489 B1 * | 9/2002 | Kimura et al. | 136/244 |
| 6,593,521 B1 * | 7/2003 | Kobayashi | 136/244 |
| 6,791,024 B1 * | 9/2004 | Toyomura | 136/251 |
| 2002/0038667 A1 * | 4/2002 | Kondo et al. | 136/293 |
| 2002/0195136 A1 | 12/2002 | Takabayashi et al. | 136/244 |
| 2003/0010373 A1 | 1/2003 | Tsuzuki et al. | 136/244 |

FOREIGN PATENT DOCUMENTS

| | | |
|---|---|---|
| JP | 57-153478 | 9/1982 |
| JP | 7-213072 | 8/1995 |
| JP | 2002-343986 | 11/2002 |

* cited by examiner

*Primary Examiner*—Nam Nguyen
*Assistant Examiner*—Anthony Fick
(74) *Attorney, Agent, or Firm*—Fitzpatrick, Cella, Harper & Scinto

(57) ABSTRACT

In a power generation system of this invention, the outputs from power generation layers electrically connected in series are input to corresponding power conversion devices, and boosted outputs are connected in parallel and fed to a load. Alternatively, the output from one of power generation layers electrically connected in series is input to a first power conversion device, and the serial output and the boosted output from the first power conversion device are connected in parallel, input to a second power conversion device, boosted, and fed to the load. Since the two power generation layers can be individually output-controlled, each power generation layer can be optimized basically without considering current balance. Since the optical spectrum utilization efficiency increases, the power generation efficiency increases. In addition, since the power can be fed not to separate loads but to one load, the convenience largely increases.

1 Claim, 15 Drawing Sheets

POWER GENERATION SYSTEM AND POWER GENERATION APPARATUS

FIELD OF THE INVENTION

The present invention relates to a power generation system and power generation apparatus which use a photovoltaic element which generates power upon receiving light such as sunlight.

BACKGROUND OF THE INVENTION

In recent years, awareness of ecological problems is growing on a worldwide scale. Especially, the deepening concern for global warming by $CO_2$ emission is increasing the demand for clean energies more than ever. At the moment, a solar battery is expected as a clean energy source because of its safety and good manageability.

Typical structures of a photovoltaic element used in a solar battery are as follows.

As the first structure, one power generation layer 101 is formed, and electrodes 102 and 103 are attached to both surfaces of the power generation layer to output electricity, as indicated by the sectional view shown in FIG. 10. Various materials are used for the power generation layer 101, including single-crystal silicon, polysilicon, crystallite silicon, amorphous silicon, and a compound semiconductor. This structure needs to have only one power generation layer and can be formed with a small number of manufacturing processes.

A transparent conductive layer is normally used as the electrode 102 on the light-receiving surface side. A metal electrode bus is sometimes used partially. The other electrode 103 has the same structure as that of the electrode 102. Alternatively, the electrode 103 may have a metal conductive layer on the entire surface or use a metal substrate as the metal conductive layer.

The output from the power generation layer 101 is supplied to a load 21 through the electrodes 102 and 103.

As the second structure, two power generation layers 111 and 112 are stacked and electrically connected in series with each other, and electrodes 113 and 114 are attached to the surfaces of the two power generation layers to output electricity, as indicated by the sectional view shown in FIG. 11.

The same material as that in the first structure can be used for the two power generation layers 111 and 112. However, when materials having different optical wavelength sensitivities are used for the power generation layers 111 and 112, the optical spectrum utilization efficiency increases, resulting in an increase in conversion efficiency. The two power generation layers 111 and 112 are connected in series. For this reason, the current balance between the two power generation layers 111 and 112 is designed not to cause IV mismatch. The electrodes 113 and 114 are the same as in the first structure.

The output from the power generation layers 111 and 112 connected in series is supplied to the load 21 through the electrodes 113 and 114.

FIG. 11 shows an example with two power generation layers. A structure having three or more power generation layers which are stacked and electrically connected in series to output electricity is also known.

As the third structure, two power generation layers 121 and 122 are formed, electrodes 123 and 124 are formed on both surfaces of the power generation layer 121 while electrodes 125 and 126 are formed on both surfaces of the power generation layer 122, and an insulating layer 127 is inserted between the electrodes 124 and 125, as indicated by the sectional view shown in FIG. 12. The power generation layers, 121 and 122 are electrically insulated from each other by the insulating layer 127.

The material of the two power generation layers 121 and 122 is the same as in the second structure. As in the second structure, when materials having different optical wavelength sensitivities are used, the optical spectrum can be effectively used. In the third structure, however, the two power generation layers 121 and 122 can be independently used because they are not electrically connected in series. Since no IV mismatch occurs, the current balance between the two power generation layers 121 and 122 need not be taken into consideration.

The uppermost electrode 123 and lowermost electrode 126 are the same as in the first structure. Each of the electrodes 124 and 125, which are located on both surfaces of the insulating layer 127, has a transparent conductive layer or may be designed to partially use a metal electrode bus, like the electrode 102 of the first structure. However, the design needs to take account of stacking the insulating layer 127 and the power generation layers 121 and 122.

The output from the power generation layer 121 is supplied to the load 21 through the electrodes 123 and 124. The output from the power generation layer 122 is supplied to a load 22 through the electrodes 125 and 126. That is, the outputs from the two power generation layers are supplied to the separate loads.

As the fourth structure, two power generation layers 131 and 132 are formed, electrodes 133 and 134 are formed on both surfaces of the power generation layer 131, and the electrode 134 and an electrode 135 are arranged on both surfaces of the power generation layer 132 such that the electrode 134 is shared by the two power generation layers 131 and 132, as indicated by the sectional view shown in FIG. 13. The power generation layers 131 and 132 are electrically connected in series (Japanese Patent Laid-Open No. 57-153478).

The output from the power generation layer 131 is supplied to the load 21 through the electrodes 133 and 134. The output from the power generation layer 132 is supplied to the load 22 through the electrodes 134 and 135. That is, the outputs from the two power generation layers are supplied to the separate loads.

The material of the two power generation layers 131 and 132 is the same as in the second and third structures. As in the second and third structures, when materials having different optical wavelength sensitivities are used, the optical spectrum can be effectively used. In the fourth structure, however, the two power generation layers 131 and 132 can be connected to separate loads and independently used although they are electrically connected in series. Since no IV mismatch occurs, the current balance between the two power generation layers need not be taken into consideration. In addition, unlike the third structure, one electrode and one insulating layer between the two power generation layers can be omitted.

The above photovoltaic elements however have the following problems.

In the first structure, since only one material is used for the power generation layer, the optical wavelength sensitivity is limited, and the optical spectrum cannot be effectively used.

In the second structure, if the current balance between the two power generation layers should be ensured, each power generation layer cannot always effectively use the optical spectrum.

In the third structure, since the two electrodes that come into contact with the both surfaces of the insulating layer 127 must be formed to have a sufficiently low resistance with respect to the generated current, the transparent conductive layer of each of the electrodes 124 and 125 must be thick. The transmission loss of a transparent conductive layer is not 0%, though it is transparent. Hence, when the transparent conductive layer becomes thick, the light amount to the power generation layer 122 on the lower side decreases. In addition, to form a thick transparent conductive layer is expensive. When a metal electrode bus is partially used, the transparent conductive layer can be thinned to some extent. Even in this case, however, the decrease in light amount and the increase in cost due to the thick transparent conductive layer are inevitable. The presence of the insulating layer 127 also poses the problems of smaller light amount and higher cost.

In the fourth structure, no insulating layer is necessary between the two power generation layers, and only one common electrode suffices between them, unlike the third structure. Hence, the decrease in light amount can be suppressed, and the cost can be reduced. However, since the two power generation layers are electrically connected in series, only loads that are usable in an electrically serial state can be used. In addition, since the two power generation layers are electrically connected in series, only a low voltage corresponding to one power generation layer can be supplied to the load. Since usable loads are limited, the application range is limited, too. Furthermore, since the feed voltage to the load is low, the wiring loss tends to be large.

SUMMARY OF THE INVENTION

It is an object of the present invention to provide a highly efficient, inexpensive, and convenient power generation system capable of efficiently using an optical spectrum.

It is another object of the present invention to provide a highly efficient, inexpensive, and convenient power generation apparatus capable of efficiently using an optical spectrum.

In order to achieve the above object, according to an aspect of the present invention, there is provided a power generation system comprising: a photovoltaic element comprising at least two power generation layers, an intermediate electrode which is inserted between the two power generation layers and includes a transparent conductive layer that is transparent and has conductivity, an upper electrode which includes an upper transparent conductive layer and is formed on an incident-light-side surface of one of the power generation layers, and a lower electrode which is formed on a surface of the other power generation layer on an opposite side to the incident light side, the two power generation layers being electrically connected in series through the intermediate electrode, and the photovoltaic element having a lead-out portion which leads out the intermediate electrode to an outside and being configured to be able to feed a power from each power generation layer to a corresponding load; and two power conversion devices, wherein outputs from the two power generation layers of the photovoltaic element are connected to input sides of the two power conversion devices, and output sides of the two power conversion devices are connected in parallel to feed the power to a load.

In order to achieve the above object, according to another aspect of the present invention, there is provided a power generation system comprising: a photovoltaic element comprising at least two power generation layers, an intermediate electrode which is inserted between the two power generation layers and includes a transparent conductive layer that is transparent and has conductivity, an upper electrode which includes an upper transparent conductive layer and is formed on an incident-light-side surface of one of the power generation layers, and a lower electrode which is formed on a surface of the other power generation layer on an opposite side to the incident light side, the two power generation layers being electrically connected in series through the intermediate electrode, and the photovoltaic element being configured to be able to extract a generated power from the upper electrode, intermediate electrode, and lower electrode; a first power conversion device in which an output obtained by receiving and power-converting an output from one of the power generation layers of the photovoltaic element is connected in parallel with a serial output from the two power generation layers; and a second power conversion device in which an output from the first power conversion device, which is connected in parallel with the serial output from the two power generation layers, is received, power-converted, and fed to a load.

In the power generation system of the present invention, the following effects can be obtained.

Each power generation layer is designed to maximize its light utilization efficiency, and the output power can be used by one load. Hence, the power generation efficiency of the photovoltaic element increases, and the convenience increases.

Since the maximum output can be extracted from each power generation layer, the power generation efficiency increases.

When a boosting converter is used, the loss in the wiring resistance can be largely reduced, and the power generation efficiency increases. Especially, in the system using the photovoltaic element of the present invention, the wiring loss reducing effect is very large.

Preferably, each of the two power conversion devices executes maximum power point tracking control of a corresponding one of the power generation layers.

The two power conversion devices may comprise a main circuit which has at least a switching element, and a control circuit which has at least a control power supply generation circuit, a switching reference waveform generation circuit which defines a switching frequency, and a switching element driving circuit which can drive the switching element at a fixed duty.

In one aspect, the two power generation layers may have polarities connected in series in a forward direction and have a control power supply generation circuit which receives and boosts the serial output from the two power generation layers and supplies a control power supply of the two power conversion devices.

In another aspect, the two power generation layers may have polarities connected in series in a reverse direction and have a control power supply generation circuit which receives and boosts parallel outputs from the two power generation layers while setting the intermediate electrode at a common potential and supplies a control power supply of the two power conversion devices.

In further aspect, the two power generation layers may have polarities connected in series in a forward direction, and an electricity extraction portion to the intermediate electrode, which is connected to one of the power conversion devices, and an electricity extraction portion to the intermediate electrode, which is connected to the other of the power conversion devices, are arranged substantially at the same portion of the lead-out portion.

In Still further aspect, the two power generation layers may have polarities connected in series in a reverse direction, the lead-out portion of the intermediate electrode is led out to the outside on both sides, an electricity extraction portion connected to one of the power conversion devices is arranged on the lead-out portion on one side, and an electricity extraction portion connected to the other of the power conversion devices is arranged on the lead-out portion on the other side.

Each of the two power conversion devices may comprise a DC-DC boosting conversion device.

In order to achieve the above object, according to still another aspect of the present invention, there is provided a power generation apparatus in which any one of the above power generation systems is integrally constituted, and the two power conversion devices are arranged near the electricity extraction portion of the power generation layer.

In the power generation apparatus of the present invention, the following effect is obtained.

Since the wiring resistance between the power conversion device and the photovoltaic element is minimized, the wiring loss can be reduced. Especially, since the voltage of the power generation layer is low, the effect is large.

According to still further aspect of the invention, there is provided a power generation system comprising a photovoltaic element which comprises at least two power generation layers, an upper electrode which includes an upper transparent conductive layer and is formed on an incident-light-side surface of one of the power generation layers, a lower electrode which is formed on a surface of the other power generation layer on an opposite side to the incident light side, the two power generation layers being electrically connected in series and having an intermediate electrode which is electrically connected in to a series connection portion, and extracts a generated power from the intermediate electrode and lower electrode, and two power conversion devices, in which outputs from the two power generation layers of the photovoltaic element are connected to input sides of the two power conversion devices, and output sides of the two power conversion devices are connected in parallel to feed the power to a load, comprising: a control power supply generation circuit which receives at least the output with a higher voltage from one of the two power generation layers and boosts the voltage to supply a control power supply of the two power conversion devices.

According to still further aspect of the invention, there is provided a power generation system comprising: a photovoltaic element comprising at least two power generation layers, an intermediate electrode which is inserted between the two power generation layers and includes a transparent conductive layer that is transparent and has conductivity, an upper electrode which includes an upper transparent conductive layer and is formed on an incident-light-side surface of one of the power generation layers, and a lower electrode which is formed on a surface of the other power generation layer on an opposite side to the incident light side, the two power generation layers being electrically connected in series through the intermediate electrode, in which a lead-out portion which leads out the intermediate electrode to an outside is arranged, an electricity extraction portion which is connected to a load of one of the power generation layers in contact with the intermediate electrode and an electricity extraction portion connected to a load of the other of the power generation layers are arranged substantially at the same portion of the lead-out portion, and a power can be fed from each power generation layer to a corresponding load; and two power conversion devices, wherein outputs from the two power generation layers of the photovoltaic element are connected to input sides of the two power conversion devices, and output sides of the two power conversion devices are connected in parallel to feed the power to a load.

According to still further aspect of the invention, there is provided a power generation system comprising: a photovoltaic element comprising at least two power generation layers, an intermediate electrode which is inserted between the two power generation layers and includes a transparent conductive layer that is transparent and has conductivity, an upper electrode which includes an upper transparent conductive layer and is formed on an incident-light-side surface of one of the power generation layers, and a lower electrode which is formed on a surface of the other power generation layer on an opposite side to the incident light side, the two power generation layers being electrically connected in series in the reverse direction through the intermediate electrode, in which a lead-out portion which leads out the intermediate electrode to an outside is arranged, an electricity extraction portion connected to a load of one of the power generation layers is arranged on the lead-out portion on one side, and an electricity extraction portion connected to a load of the other of the power generation layers is arranged on the lead-out portion on the other side, and a power can be fed from each power generation layer to a corresponding load; and two power conversion devices, wherein outputs from the two power generation layers of the photovoltaic element are connected to input sides of the two power conversion devices, and output sides of the two power conversion devices are connected in parallel to feed the power to a load.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1:
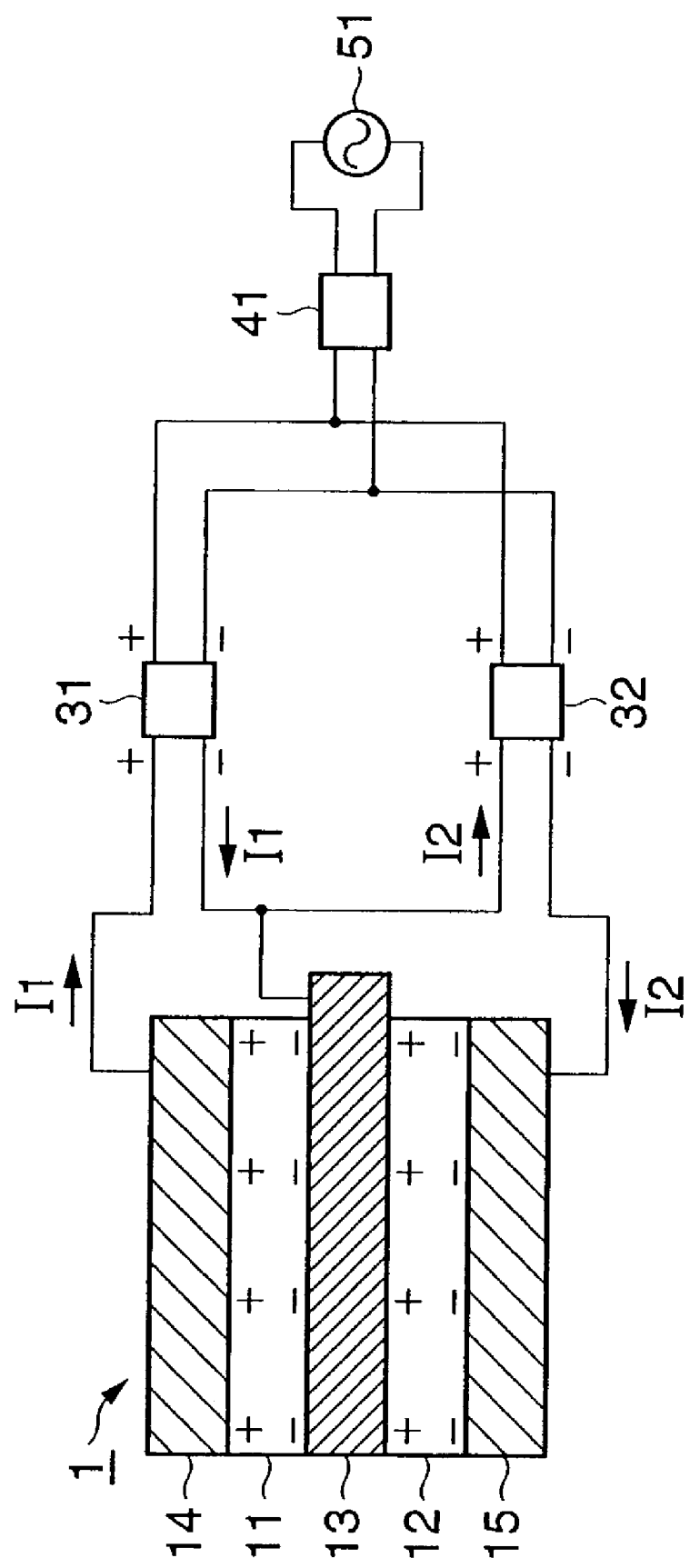
FIG. 1 is a view showing an example of the arrangement of a power generation system according to the present invention.

Preferred embodiments of the present invention will be described below in detail with reference to the accompanying drawings.

In the embodiments of the present invention, the output from each of power generation layers electrically connected in series is input to a corresponding power conversion device, and the boosted outputs are connected in parallel and fed to a load. Alternatively, the output from one of power generation layers electrically connected in series is input to a first power conversion device, the outputs from the series-connected power generation layers and the boosted output from the first power conversion device are parallelly input to a second power conversion device, boosted, and fed to a load.

When the above arrangements are applied, the outputs from two power generation layers can be individually controlled. For this reason, each power generation layer can be optimized basically without considering the current balance. The optical spectrum utilization efficiency increases, and the power generation efficiency increases. In addition, since power can be fed not to separate loads but to one load, the convenience greatly improves.

Furthermore, when an electricity extraction portion to each load is arranged at almost the same position of the leading portion of the intermediate electrode, the current of the upper power generation layer and that of the lower power generation layer flow in reverse directions and cancel each other in the intermediate electrode. The current that actually flows corresponds to the difference between the currents of the two power generation layers. Since the current is greatly suppressed, any voltage drop can be suppressed, and the power generation efficiency can be increased. Accordingly, since the transparent conductive layer of the intermediate electrode can be much thinner, the cost can be reduced. Since only one thin transparent conductive layer is required, the transmission loss of light can be satisfactorily decreased. Hence, the light utilization ratio can be increased, and the power generation efficiency can be increased. Since the two power generation layers output voltages to separate loads, each power generation layer can be optimized basically without considering the current balance. The optical spectrum utilization efficiency increases, and the power generation efficiency increases.

Moreover, two power generation layers are electrically connected in series in reverse directions. The intermediate electrode is led out to the outside on both sides to form two lead-out portions. The electricity extraction portions of the respective power generation layers, which are connected to two loads, are connected to the lead-out portions, respectively. Accordingly, the current of the upper power generation layer and that of the lower power generation layer flow in reverse directions and cancel each other in the intermediate electrode. The current that actually flows corresponds to the difference between the currents of the two power generation layers and greatly decreases. The effect of current cancel is smallest at the two ends of the intermediate electrode and large almost at the center of the intermediate electrode. Accordingly, any voltage drop can be suppressed, and the power generation efficiency can be increased. In addition, since the transparent conductive layer of the intermediate electrode can be much thinner, the cost can be reduced. Since only one thin transparent conductive layer is required, the transmission loss of light can be decreased. Hence, the light utilization ratio can be increased, and the power generation efficiency can be increased. Since the two power generation layers output voltages to separate loads, each power generation layer can be optimized basically without considering the current balance. The optical spectrum utilization efficiency increases, and the power generation efficiency increases.

In another embodiment of the present invention, two power conversion devices are independently MPPT-controlled. With this arrangement, a maximum power can be extracted from each of power generation layers having different power generation characteristics, and the power generation efficiency increases.

When each of two power conversion devices is constituted by a boosting converter, a voltage can be boosted to a desired voltage suitable to a load. In addition, the output current becomes small, and the wiring loss to the load can be reduced. Since the output voltage from one power generation layer is low, the wiring loss reducing effect obtained by boosting the voltage and feeding it to the load is very large. Especially, when the boosting ratio of the boosting converter is high, the wiring loss reducing effect is enormous.

In the control power supply generation circuit of a power conversion device, when series-connected voltages of two power generation layers are input, the boosting ratio in generating the control power supply becomes low, and the conversion loss can be reduced. The control power supply generation circuit may be shared by two power conversion devices. In this case, the cost and loss can be reduced.

In a power generation apparatus in which two power conversion devices are arranged near the lead-out portions of the intermediate electrode and integrated, the wiring loss can be reduced. In the photovoltaic element of the present invention, which is designed to have a low voltage and large current, the wiring loss reducing effect is very large.

The constituent elements of the power generation system and power generation apparatus according to the present invention will be described below.

[Power Generation Layer]

The power generation layer used in this embodiment is not particularly limited. For example, single-crystal silicon, polysilicon, crystallite silicon, amorphous silicon semiconductor having a pn junction or pin junction can be used. As compound semiconductors, III–V compounds, II–VI compounds, I–III–VI compounds, and the like can be used, so various power generation structures can be used. A dye-sensitized structure and the like can also be applied.

When materials having different optical wavelength sensitivities are combined as power generation layers, the optical spectrum of incident light can be effectively used. Although the combination is not particularly limited, it is preferable that the band gap of the lower power generation layer on the incident light side be wider than that of the lower power generation layer. Materials having the same optical wavelength sensitivity may be used for the two power generation layers.

A power generation layer need not always have only a single power generation structure and may have a plurality of power generation structures stacked and electrically connected in series. As the plurality of power generation structures, power generation structures of the same type or different types can be appropriately selected. In this case, the current balance in each power generation structure is preferably designed not to cause IV mismatch in the same power generation layer.

The present invention can be applied not only to a structure having two power generation layers but also to a structure having three or more power generation layers. More specifically, intermediate electrodes are formed between the power generation layers. The power generation layers are electrically connected in series through the intermediate electrodes such that power can be fed to loads corresponding to the respective power generation layers through lead-out portions that externally lead out the intermediate electrodes, and also, power can be fed to the loads of the upper and lower power generation layers of each intermediate electrode from almost the same position of each lead-out portion. Even in this case, the generated currents of the power generation layers on both sides of each intermediate electrode flow in reverse directions and cancel each other to reduce the voltage drop, like the structure having two power generation layers.

Since the current cancel effect in the intermediate electrode is used, the current cancel effect becomes small if the magnitudes of the currents in the two power generation layers are extremely different (for example, if the current magnitude ratio is 1:10). Preferably, the ratio of the currents of the two power generation layers is designed to be about 1:2. More preferably, the ratio is designed to be about 8:10 or 9:10.

[Upper Electrode]

The upper electrode used in this embodiment only needs to have at least a transparent conductive layer. For more effective current collection, the upper electrode preferably has a current collection electrode having a low resistance whose effect is large when the area of one photovoltaic element is large, and the generated current is large. These electrodes can be formed by applying one of known or utilized structures. The transparent conductive layer and current collection electrode will be described later in detail.

The position of an electricity extraction portion which connects the wire from the upper electrode to the load is not particularly limited. When the electricity extraction portion is formed near the electricity extraction portion of the intermediate electrode, the wiring length can be made small, and the loss due to the wiring resistance can be reduced.

[Intermediate Electrode]

The intermediate electrode also has a transparent conductive layer which effectively collects the current from the power generation layer. For more effective current collection, the intermediate electrode preferably has a current collection electrode having a low resistance whose effect is large when the area of one photovoltaic element is large, and the generated current is large.

In the intermediate electrode, the magnitude of the current that flows is smaller than that in the upper electrode. For this reason, the transparent conductive layer can be thinned or the sectional area of the current collection electrode can be reduced to decrease the projecting area of the current collection electrode viewed from the upper side. Hence, the optical loss by the intermediate electrode can be decreased, and the power generation efficiency can be increased. In addition, the intermediate electrode can be formed at a low cost. The power generation efficiency and current collection electrode will be described later in detail.

In a structure having upper and lower power generation layers with different optical wavelength sensitivities, the optical wavelength range including the optical wavelength sensitivity of the upper power generation layer may be reflected by the intermediate electrode. In this case, the power generation efficiency can be increased.

In a structure in which two power generation layers are electrically connected in series through the intermediate electrode, the electrical wiring from the lead-out portion of the intermediate electrode to each load is designed to be shared to the near of the load as much as possible. In this electrical wiring, the currents of the upper and lower power generation layers flow in reverse directions and cancel each other to reduce the actually flowing current, as in the intermediate electrode, so the wiring loss can be reduced.

[Lower Electrode]

The lower electrode used in this embodiment is not particularly limited except that it is required to have a work function that ensures an Ohmic contact with a semiconductor layer.

As a material, such as Al, Ag, Pt, Au, Ni, Ti, Mo, Fe, V, Cr, Cu, stainless steel, brass, nichrome, $SnO_2$, $In_2O_3$, ZnO, or ITO, that is a so-called single metal element, an alloy or a transparent conductive oxide (TCO) is used.

In a general example, a metal film is formed by vapor deposition or sputtering, or a film is formed by screen-printing a silver paste. When a photovoltaic element is formed on a metal substrate, the metal substrate can serve as the lower electrode.

When the lower electrode also serves as a lower-surface reflecting means, light can be reflected by the upper surface or inner surface of the lower electrode. Further, the light utilization efficiency can be increased by the light trapping effect with diffused reflection of the light in the texture structure.

The position of an electricity extraction portion which connects the wire from the lower electrode to the load is not particularly limited. When the electricity extraction portion is formed near the electricity extraction portion of the intermediate electrode, the wiring length can be made small, and the loss due to the wiring resistance can be reduced.

[Transparent Conductive Layer]

The transparent conductive layer collects the current generated by the power generation layer and is necessary for a semiconductor such as amorphous silicon having a high sheet resistance. In a crystal-based solar battery, the sheet resistance is low, and the semiconductor layer can also be used as the transparent conductive layer.

To cause the power generation layer to efficiently absorb light from the sun or a cool white fluorescent lamp, the light transmittance is preferably 85% or more. As for the electrical characteristic, the sheet resistance value is preferably 100 $\Omega/\square$ or less such that the current generated by light flows in the horizontal direction with respect to the power generation layer. Examples of a material having such characteristics are metal oxides such as $SnO_2$, $In_2O_3$, ZnO, CdO, $CdSnO_4$, ITO ($In_2O_3+SnO_2$).

The upper transparent conductive layer of the upper electrode can also serve as an anti-reflection means.

[Current Collection Electrode]

The current collection electrode is generally formed on the transparent conductive layer of the upper electrode to have, e.g., a comb or radial shape. A suitable width or pitch is determined from the sheet resistance value of the transparent conductive layer. In the present invention, the intermediate electrode between the power generation layers is also formed to have, e.g., a comb or radial shape, and a suitable width or pitch is determined from the sheet resistance value of the transparent conductive layer.

The current collection electrodes of the upper electrode and intermediate electrode may have the same pitch and may be arranged to overlap when viewed from the incident light side. In this case, the loss due to the shade by the opaque current collection electrode can be minimized.

The current collection electrode is also required to have a low resistivity and not to become a series resistance of the photovoltaic element. The resistivity is preferably $10^{-2}$ Ωcm to $10^{-6}$ Ωcm. As the material of the current collection electrode, a metal such as Ti, Cr, Mo, W, Al, Ag, Ni, Cu, Sn, or Pt or an allow thereof, or a metal line having a surface coated with solder or a conductive adhesive is used.

Generally, the current collection electrode of the upper electrode uses a metal paste made of metal powder and polymer resin binder. However, the material is not limited to this.

The shape of the current collection electrode of the intermediate electrode is not particularly limited as long as the upper and lower power generation layers can be formed without any problem. For example, a crystal silicon wafer may used as the lower power generation layer. The wafer surface may be etched by irradiating it with a laser beam to form grooves having a predetermined pitch and depth, and a current collection electrode may be formed in the grooves by electroless plating. With this method, the current collection electrode can be made thicker than the transparent conductive layer. The light utilization efficiency can be increased by thinning the transparent conductive layer and reducing the width of the current collection electrode. In addition, the wiring resistance can be reduced by increasing the thickness and thus increasing the sectional area of the current collection electrode. The current collection electrode may be embedded not only in one power generation layer but also in two power generation layers.

[Substrate]

The substrate is a member which mechanically supports the power generation layer made of a thin film of, e.g., amorphous silicon. The substrate is also used as an electrode. Hence, it must have a resistance to the temperature in forming the semiconductor layer. The substrate may be either a conductive or insulating substrate.

Examples of the conductive material are metals such as Fe, Ni, Cr, Al, Mo, Au, Nb, Ta, V, Ti, Pt, and Pb and an alloy thereof, including a thin plate of brass or stainless steel, a composite thereof, carbon sheet, and galvanized sheet. Examples of the insulating material are films or sheets made of heat-resistant synthetic resins such as polyester, polyethylene, polycarbonate, cellulose acetate, polypropylene, polyvinyl chloride, polyvinylidene chloride, polystyrene, polyamide, polyimide, and epoxy; composites of these materials and glass fiber, carbon fiber, boron fiber, or metal fiber; a thin plate of the metal or resin sheet having a surface coated with a metal thin film of a different material or an insulting thin film made of $SiO_2$, $Si_3N_4$, $Al_2O_3$, or AlN and formed by sputtering, vapor deposition, or metal plating; and glass and ceramics.

For single-crystal or polysilicon, no support substrate is prepared, and the single-crystal wafer or polysilicon wafer serves as a substrate. A single-crystal wafer is obtained by cutting a silicon ingot pulled up by CZ. A polysilicon wafer is formed by cutting a silicon ingot obtained by casting or obtaining a sheet-shaped polycrystal by the ribbon method.

[Terminal Member]

A terminal member is electrically connected to the electrode to form an output terminal. The terminal member is attached to the electrode and, more preferably, the current collection electrode using laser welding, a conductive adhesive, or brazing to have a low electrical resistance and high mechanical strength. Alternatively, the terminal member is attached to the current collection electrode by using an insulating pressure sensitive adhesive double coated tape and pressing.

The electrical performance required of the terminal member and its material are almost the same as those of the current collection electrode.

When a terminal member is necessary for connecting a power conversion device or inverter, the terminal member is connected to the electrode by using laser welding, a conductive adhesive, or brazing.

[Coating Material]

Normally, a coating member is used to make the photovoltaic element maintain the power generation performance in its use environment. As the coating member, a known member can be used. Coating members are generally roughly classified into three types: a top surface coating member, filling member, and bottom surface coating member.

[Top Surface Coating Member]

The top surface coating member is required to be translucent and weather proof and also free from contaminant attachment. As a material, a weatherproof transparent film such as a glass or a fluorocarbon resin made of polyethylene tetrafluoroethylene (ETFE), polyethylene trifluoride, polyvinyl fluoride, or the like can be used. However, the present invention is not limited to these materials. A weatherproof transparent film has a satisfactory filling property, is lightweight, and does no break upon receiving an impact. When the film surface is embossed, glare of the surface reflection of sunlight can be prevented. A surface treatment such as a corona discharge treatment may be executed for the bonding interface to the filler such that the filler can easily stick to the surface. A so-called white glass plate having a high transmittance is preferably used as a glass member. Tempered glass which has a higher mechanical strength and can hardly break is often used. The glass plate may also serve as a substrate.

[Filler]

The filler must have a weather resistance, thermoplasticity, thermal adhesive property, and light transmission. As a material, a transparent resin such as EVA (vinyl acetate-ethylene copolymer), butyral resin, silicone resin, epoxy resin, polyimide fluoride resin, or the like can be used. However, the present invention is not limited to these materials. When a crosslinking agent is added to the filler, it may be cross-linked. To suppress optical degradation, the filler preferably contains an UV absorber. In addition, to increase the resistance to cracks, the filler may contain an inorganic material such as glass fiber.

[Bottom Surface Coating Member]

The bottom surface coating member is used to maintain the electrical insulating properties between the photovoltaic element and the outside by coating the lower surface side of the photovoltaic element. The bottom surface coating member is required to be formed from a flexible material which is able to ensure sufficient electrical insulting properties and also has an excellent long-term durability and a resistance against an impact, scratches, thermal expansion, and thermal shrinkage. As a suitable material, a plastic film made of nylon or polyethylene terephthalate (PET) can be used.

Even with only the filler, the electrical insulating properties can be maintained. However, since the thickness readily varies, the photovoltaic element may short-circuit to the outside at a thin film portion or a pinhole portion. The bottom surface coating member is used to prevent it.

A metal steel plate can also be used as the bottom surface coating member. For example, a stainless steel plate, plated steel plate, or galvanium steel plate can be used, though the present invention is not limited to these materials. In this case, it is difficult to maintain the electrical insulating properties between the outside and the photovoltaic element. For this reason, an insulting film is inserted between the photovoltaic element and the metal steel plate to form the bottom surface coating member. As the insulating film, a plastic film made of nylon or polyethylene terephthalate (PET) can be used.

[Power Conversion Device]

The power conversion device according to the present invention will be described in detail.

The power conversion device comprises a main circuit which converts a DC power into a desired power, a control circuit which controls activation/stop of power conversion, optimization of the operating point of the solar battery, and operation mode, a protective circuit, a communication circuit, input and output terminals, and the like. The outputs from two power conversion devices are connected in parallel with the load, input to an inverter and used in the load, or grid connected.

The basic arrangement of the power conversion device may be a converter or inverter. Any main circuit which can connect the outputs from two power conversion devices in parallel can be used independently of whether the input and output terminals are insulated or not. A converter is preferably used because it can easily connect the outputs in parallel and also can reduce and size and cost.

When a boosting converter is used as the power conversion device of the present invention such that a voltage is boosted to, e.g., 160 V or 320 V and output, the boosting converter can be used in a grid connected inverter. It is preferable because the utilization efficiency of the power generation layer can be increased, the wiring loss between the grid connected inverter and the load can be greatly reduced, and an inexpensive wiring member with high workability can be used. The photovoltaic element according to the present invention is hard to design to obtain high power generation system performance by series connection. Hence, the wiring loss reducing effect by providing the boosting converter at the output of the low-voltage large-current photovoltaic element is very large.

As the main circuit, various known circuit arrangements can be used regardless of whether the circuit is or is not insulated. The control circuit has, e.g., a CPU, PWM waveform control circuit, maximum power point tracking control circuit, control power supply generation circuit, frequency/voltage reference generator, and switching control circuit.

The control circuit may be operated from the outside through a communication line or the like. Some of the functions of the control circuit may be arranged outside the power conversion device to systematically control a plurality of power conversion devices.

In the power conversion device according to the present invention, to simplify the structure as much as possible and realize cost reduction and improvement of reliability, the control circuit preferably has at least a control power supply generation circuit, a switching reference waveform generation circuit which defines the switching frequency, and a switching element driving circuit capable of driving the switching element by a fixed duty.

Additionally, in the power conversion device according to the present invention, to reduce the cost and increase the reliability, the control circuit preferably has at least a control power supply generation circuit, a switching reference waveform generation circuit which defines the switching frequency, a switching element driving circuit capable of driving the switching element by a variable duty, and a maximum power point tracking circuit and can adjust the duty by the maximum power point tracking circuit.

The main circuit preferably has a switching element which is turned on/off by the switching element driving circuit and a transformer formed at a predetermined turn ratio. For the switching element, the conductive state preferably has a low resistance in accordance with the conducting current to suppress the conducting loss. A MOSFET is preferably used because the input voltage is very low.

In addition, the turn ratio of the two power conversion devices is designed to be inversely proportional to the maximum power voltage of each power generation layer. In this case, the conversion efficiency of the power conversion devices increases, and the power conversion devices operate almost at the same duty. Hence, the control circuit can be simplified.

It is preferable that the boost ratio of the switching transformers of the power conversion devices which input the outputs from the two power generation layers of the photovoltaic element be inversely proportional to the maximum output-voltage operating point of the connected power generation layer.

When a power conversion device such as a grid connected inverter is used as the load connected to the output of the power conversion device, and maximum power point tracking control is executed by the grid connected inverter, the power generation efficiency can be increased by extracting the maximum power from the two power generation layers.

In a system in which the outputs of the power conversion devices of a plurality of photovoltaic elements are connected in parallel, the maximum power points of the respective power generation layers of all the photovoltaic elements can be moved at once by a single grid connected inverter on the output side.

In the power generation system according to the present invention in which the outputs from the power generation layers of the photovoltaic element in which two power generation layers are electrically connected in series are input to the power conversion devices, respectively, the positive input terminal of one power conversion device and the negative input terminal of the other power conversion device have the same potential. When the input and output terminals are not insulated, for example, only one of the outputs is inverted and amplified while using equipotential lines as a reference. In an arrangement having input and output terminals that are insulated from each other, the two power conversion devices can be constituted using the same circuit scheme. The insulating means is not particularly limited. However, an insulating transformer driven at a high frequency is suitably used.

The control power supply generation circuit of the power conversion device according to the present invention can use a known circuit scheme such as a transformer scheme, chopper scheme, or switched capacitor scheme. With the chopper scheme, a desired control power supply voltage can be efficiently and inexpensively generated using a simple arrangement in response to an arbitrary input voltage from the photovoltaic element.

In the power generation system according to the present invention in which the outputs from the power generation layers of the photovoltaic element in which two power generation layers are electrically connected in series are input to the power conversion devices, respectively, preferably, the input to the control power supply generation circuit of the power conversion device is received from the upper and lower electrodes of the photovoltaic element and power-converted, and two different ground potential outputs are constituted as the control power supply generation circuit of each power conversion device. In this case, a problem that a control power supply generation circuit having one power generation layer with a low voltage is hardly activated and the conversion efficiency is low is largely improved by using the series-connected voltages of the two power generation layers. In addition, since one control power supply generation circuit suffices, the size and cost can be reduced. The circuit scheme of the control power supply generation circuit is not particularly limited. However, it is preferable to prepare a transformer having two output windings and rectify and use the outputs from the windings.

In the power generation system according to the present invention in which the outputs from the power generation layers of the photovoltaic element in which two power generation layers are electrically inversely connected in series are input to the power conversion devices, respectively, preferably, one input to the control power supply generation circuit of the power conversion device is received from the intermediate electrode at a common potential, the other input is received in parallel from the upper and lower electrodes of the photovoltaic element, these inputs are power-converted using the common potential as a reference and supplied in parallel to the control power supply generation circuit of the power conversion device. In this case, one control power supply generation circuit suffices and can be constituted by a simple circuit using, e.g., a boost chopper scheme. For this reason, the size and cost can be reduced.

To input the output from the photovoltaic element at a low loss, the power conversion device is preferably arranged near the photovoltaic element and, more preferably, directly attached to the photovoltaic element. The photovoltaic element according to the present invention can hardly efficiently generate power by connecting the photovoltaic elements. Hence, the effect of the above arrangement is large in effectively using the output from the power generation layer at a low voltage.

When the power conversion device is formed as a chip and electrically connected to the surface wiring member, intermediate wiring member, and conductive substrate during the photovoltaic element manufacturing step, the series of operations of connecting the power conversion device to the photovoltaic element can be simplified.

The encapsulating material of the power conversion device must have characteristics such as a thermal resistance, humidity resistance, water resistance, electrical insulating property, low temperature resistance, oil resistance, weathering resistance, shock resistance, and waterproofness. The encapsulating material preferably has a good adhesion to an adhesive to firmly fix the power conversion device to solar cells or support.

When the above factors are taken into consideration, examples of plastic materials that can be used as the encapsulating material are resins such as polycarbonate, polyamide, polyacetal, modified PPO (PPE) polyester, polyallylate, unsaturated polyester, phenol resin, epoxy resin, polybutylene terephthalate, and nylon; and an engineering plastic. Thermoplastic resins such as ABS resin, polypropylene, and polyvinyl chloride can also be used.

When the power conversion device is attached to the light-receiving side of the solar cells, carbon black may be used as a pigment or a resin coating that absorbs UV rays is preferably applied to the surface to increase the UV light resistance.

The characteristic features of the present invention will be described below in detail on the basis of the embodiments.

[First Embodiment]

FIG. 1 is a view showing the arrangement of a power generation system according to the present invention.

A photovoltaic element 1 used in the power generation system will be described first using the schematic sectional view shown in FIG. 2.

The photovoltaic element 1 is constituted by stacking an upper electrode 14, power generation layer 11, intermediate electrode 13, power generation layer 12, and lower electrode 15 sequentially from the incident light side. Both the power generation layers 11 and 12 are designed to have positive polarity on the surfaces on the incident light side. The power generation layers 11 and 12 are electrically connected in series through the intermediate electrode 13.

The power generation layers 11 and 12 have different optical wavelength sensitivities to effectively use the optical spectrum of incident light. The power generation layers 11 and 12 are formed to increase the sum of the outputs from the power generation layers and have different current characteristics.

Figure 2:
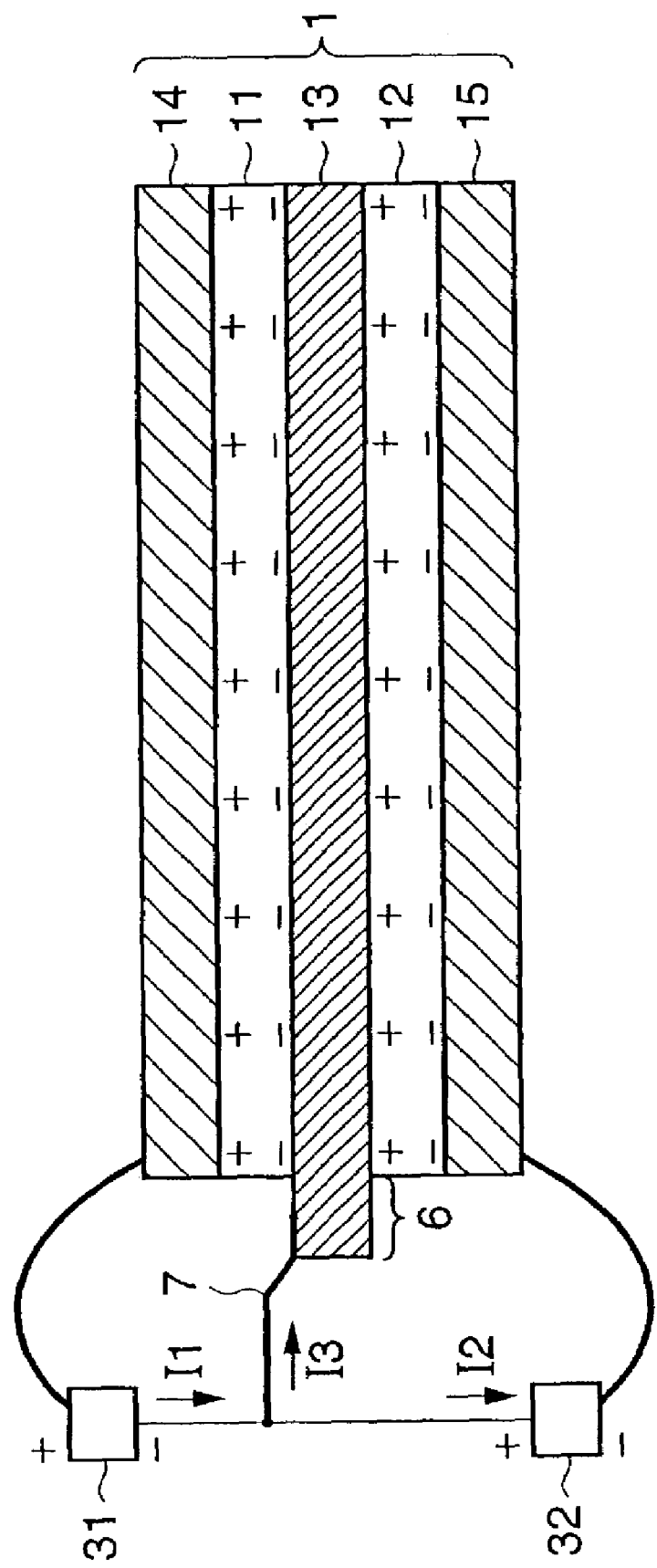
FIG. 2 is a schematic sectional view showing an example of a photovoltaic element.

The intermediate electrode 13 has a lead-out portion 6 led out to the left side in FIG. 2 and a common electricity extraction portion 7 to be connected to boosting converters 31 and 32. The intermediate electrode 13, upper electrode 14, and lower electrode 15 have output terminals (not shown) on the left side in FIG. 2. These electrodes are wired through the output terminals and connected to the boosting converters. Currents generated in the power generation layers 11 and 12 are collected by the upper electrode 14, intermediate electrode 13, and lower electrode 15 in the horizontal direction in FIG. 2 and output to the output terminals.

The output from the power generation layer 11 is fed to the boosting converter 31 as a current I1 through the upper electrode 14 and intermediate electrode 13. The output from the power generation layer 12 is fed to the boosting converter 32 as a current I2 through the intermediate electrode 13 and lower electrode 15.

In the photovoltaic element 1 having the above arrangement, the current in the intermediate electrode 13 can be largely reduced. This will be described with reference to FIG. 3. In the graph shown in FIG. 3, the abscissa represents the horizontal position in FIG. 2. The left side of FIG. 2 corresponds to the left side of FIG. 3. The ordinate represents a current that flows through the intermediate electrode 13 in the horizontal direction at that position. The current that flows to the right of FIG. 2 is a positive current.

Figure 3:
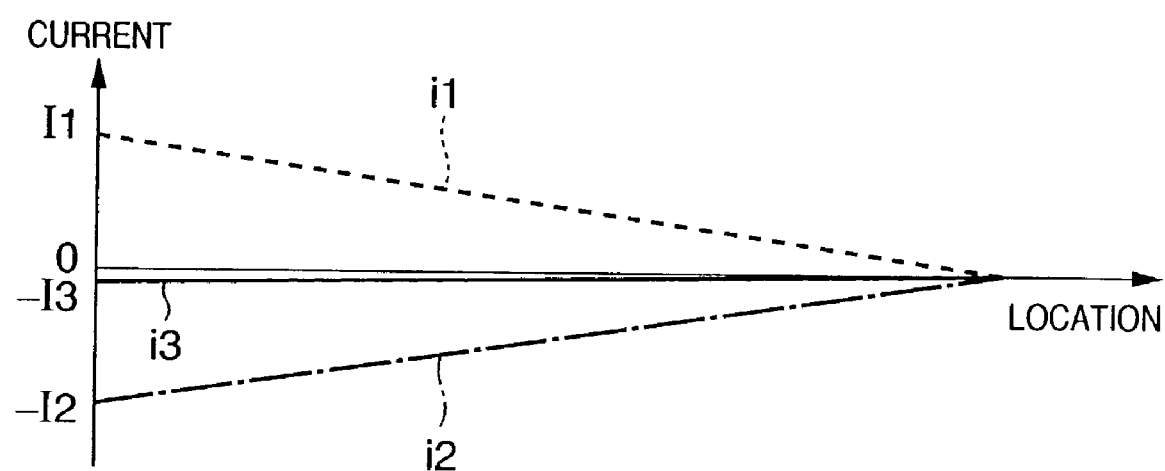
FIG. 3 is a graph for explaining the operation of the photovoltaic element.

A current i1 by the power generation layer 11 is indicated by the dotted line in FIG. 3. The current of the power generation layer 11 is collected to the left end and flows through the intermediate electrode 13 to the right side. As the current distribution, the current i1 corresponds to the current I1 at the left end and to zero at the right end.

A current i2 by the power generation layer 12 is indicated by the alternate long and short dashed line in FIG. 3. The current of the power generation layer 12 is also collected to the left end and flows through the intermediate electrode 13 to the left side. As the current distribution, the current i2 corresponds to the current −I2 at the left end and to zero at the right end.

When the power generation layers 11 and 12 simultaneously generate powers, the currents i1 and i2 simultaneously flow to the intermediate electrode 13 and combine. The currents i1 and i2 cancel each other because they flow in reverse directions, so a current i3 indicated by the solid line in FIG. 3 flows. In the example shown in FIG. 3, since I2>I1, the current flows through the intermediate electrode 13 to the left side. A current having a magnitude I3=I2−I1 flows at the left end.

As is apparent from the above description, the current flowing through the intermediate electrode 13 can be largely decreased. Hence, the intermediate electrode 13 can be made thin, so the optical transmission loss and cost can be reduced. When a current collection electrode (not shown) is to be formed on the intermediate electrode 13, the sectional area of the current collection electrode can be decreased. Since the width of the current collection electrode decreases, the light amount for the power generation layer 12 increases, and the power generation efficiency increases.

Since the power generation layers 11 and 12 feed power to separate boosting converters, the so-called IV mismatch does not occur. The outputs from the respective power generation layers can be effectively used. In addition, since the power generation layers 11 and 12 need not have the current balance, the light utilization efficiency of each power generation layer can be increased.

In this embodiment, only one lead-out portion 6 and one electricity extraction portion 7 are formed. However, the present invention is not limited to this. For example, the lead-out portion 6 or electricity extraction portion 7 maybe formed on each of the left and right sides of FIG. 2. The extraction portion of the electricity extraction portion 7 to the two boosting converters 31 and 32 is preferably almost the same.

The power generation system having the photovoltaic element 1 has the two boosting converters 31 and 32. The output from the power generation layer 11 is connected to the input terminal of the boosting converter 31, and the output from the power generation layer 12 is connected to the input terminal of the boosting converter 32. The outputs from the two boosting converters 31 and 32 are connected in parallel and connected to the input terminals of a grid connected inverter 41. The outputs from the grid connected inverter 41 are connected to a commercial power system 51.

Figure 4:
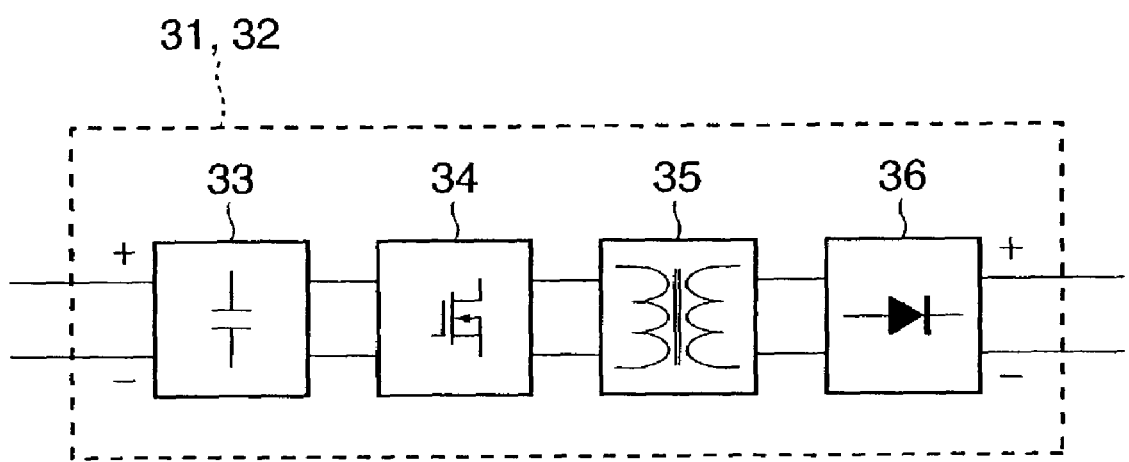
FIG. 4 is a view showing an example of the arrangement of a boosting converter.

Each of the boosting converters 31 and 32 has the arrangement shown in FIG. 4. An input power is smoothed by a smoothing capacitor 33, converted into a high-frequency power by a switching means 34, and input to a transformer 35. The power is boosted and insulated by the transformer 35. An output from the transformer 35 is rectified by a rectifying means 36 to be converted into a boosted DC power. The boosting converter is designed in consideration of the duty of the switching means 34 and the turn ratio of the transformer 35 such that the voltage can be boosted to a voltage suitable for the operation of the grid connected inverter 41 on the output side.

Figure 5:
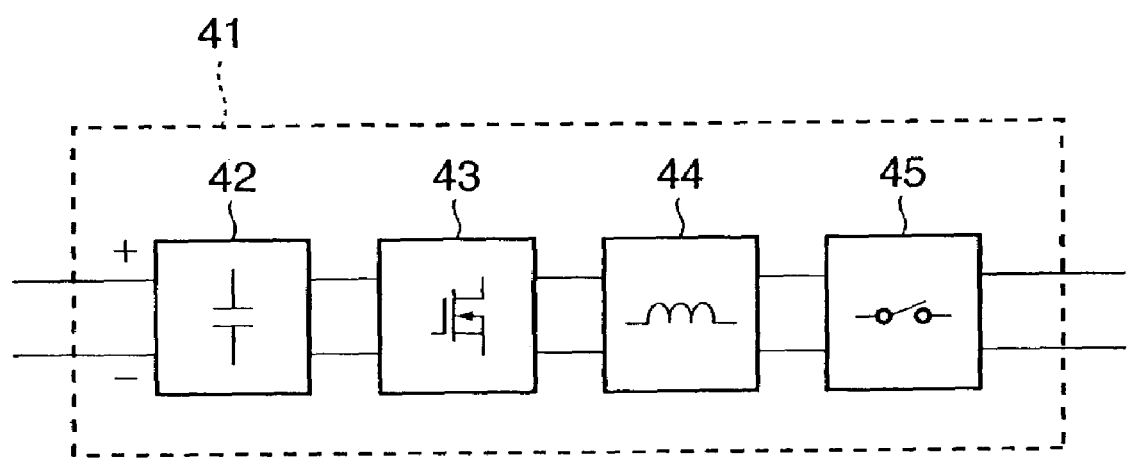
FIG. 5 is a view showing an example of the arrangement of a grid connected inverter.

The grid connected inverter 41 has the arrangement shown in FIG. 5. An input power is smoothed by a smoothing capacitor 42 and power-converted by a switching means 43. A smooth current is output through an interconnection reactor 44 and output to the commercial power system 51 through an interconnection relay 45.

In this embodiment, to reduce the cost and increase the reliability of the control circuit (not shown) of the boosting converters 31 and 32, the control circuit is simply constituted by a control power supply generation circuit, a switching reference waveform generation circuit which defines the switching frequency, and a switching element driving circuit capable of driving a switching element at a fixed duty. In addition, turn ratios N1 and N2 of the transformers 35 of the boosting converters 31 and 32 are designed such that they output the same output voltage Vol when the converters 31 and 32 operate at fixed duties D1 and D2, respectively, and the power generation layers 11 and 12 are at maximum power voltages Vpm1 and Vpm2, respectively. More specifically, the control circuit is designed such that the output voltage Vol=Vpm1×D1×N1=Vpm2×D2×N2. With this design, the different maximum power voltages of the power generation layers 11 and 12 are mapped to become the same maximum power voltage on the output side of the boosting converter.

The grid connected inverter 41 controls the outputs from the two boosting converters 31 and 32 by maximum power point tracking control and operates the maximum power voltage of the characteristic mapped on the boosting converter side. That is, each of the power generation layers 11 and 12 generates a power at a corresponding maximum power point. Hence, the power generation efficiency of each power generation layer can be maximized.

With the above arrangement, in the power generation system according to the present invention, the outputs from the respective power generation layers can be used by one load, resulting in an increase in convenience. In addition, since the power generation efficiency of each power generation layer of the photovoltaic element can be maximized, a larger power can be supplied to the load.

Furthermore, since each boosting converter is switched at a fixed duty and formed to have an appropriate transformer turn ratio, the cost of the control circuit can be reduced, and the reliability can be increased while maximizing the power generation efficiency of each power generation layer.

In this embodiment, a fixed duty is employed. However, a variable duty may be used. In this case, the duties are combined such that no interference with the control operation of the grid connected inverter on the output side occurs. Even in this arrangement, each power generation layer can be operated at the maximum power point.

In this embodiment, the grid connected inverter 41 controls the input voltage by maximum power point tracking control. However, the present invention is not limited to this, and another arrangement for, e.g., controlling the output current instruction value may be applied.

[Second Embodiment]

The second embodiment according to the present invention will be described next.

Figure 6:
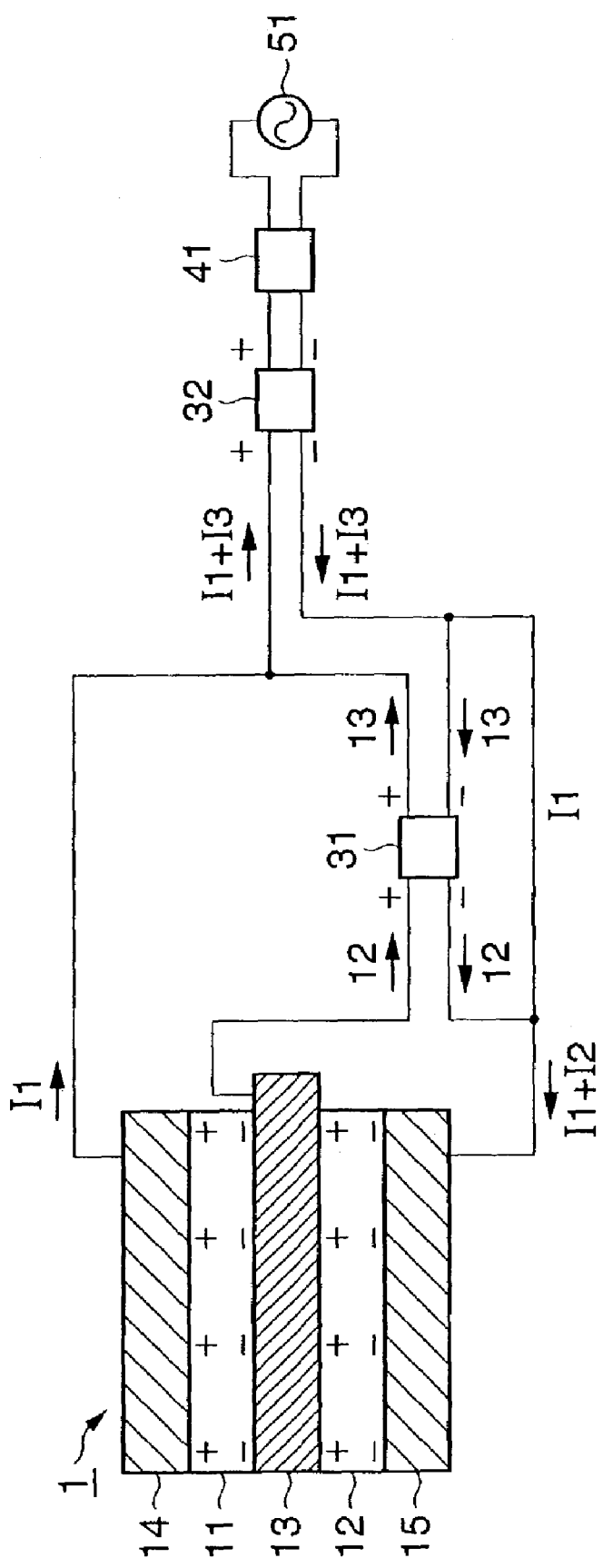
FIG. 6 is a view showing an example of the arrangement of a power generation system according to the present invention.

FIG. 6 is a view showing the arrangement of a power generation system according to the present invention. The same reference numerals as in FIG. 1 of the first embodiment denote the same parts in FIG. 6. In this embodiment, the generated current of a power generation layer 12 is larger than that of a power generation layer 11. Points different to the first embodiment will be described below.

FIG. 6 is different from FIG. 1 in the connection relationship between a photovoltaic element 1 and boosting converters 31 and 32. The output from the power generation layer 12 is connected to the input terminal of the boosting converter 31. The output from the boosting converter 31 is connected in parallel with the serial output from the power generation layers 11 and 12. The serial output from the power generation layers 11 and 12 and the output from the boosting converter 31 are connected in parallel with the input terminal of the boosting converter 32. The two outputs from the boosting converter 32 are connected to the input terminals of a grid connected inverter 41.

In the power generation system having the above arrangement, the output voltage from the power generation layer 12 is boosted by the boosting converter 31 and connected in parallel with the serial output from the power generation layers 11 and 12 to form one output. This voltage is boosted to a higher voltage by the boosting converter 32 and fed to the grid connected inverter 41.

A turn ratio N1 of a transformer 35 of the converter 31 is designed such that an output voltage Vol from the boosting converter 31 becomes the same as a sum Vpm1+Vpm2 of the maximum power voltages of the two power generation layers when the converter 31 operates at a fixed duty D1, and the power generation layers 11 and 12 are at the maximum power voltages Vpm1 and Vpm2, respectively. More specifically, it is designed such that the output voltage Vol=Vpm2×D1×N1=Vpm1+Vpm2. With this arrangement, the maximum power voltage of the power generation layer 12 is mapped to become the same maximum power voltage as the serial output from the power generation layers 11 and 12 on the output side of the boosting converter 31.

Accordingly, of the generated current of the power generation layer 12, the generated current component of the power generation layer 11 is output as the serial output from the power generation layers 11 and 12 and input to the boosting converter 32. In addition, of the generated current of the power generation layer 12, a component that exceeds the generated current of the power generation layer 11 is output as the output from only the power generation layer 12 and input to the boosting converter 31, boosted by the boosting converter 31, and input to the boosting converter 32. Hence, the power generation layers 11 and 12 operate at the maximum power points, and the power generation efficiency of each power generation layer can be maximized.

With the above-described arrangement, in the power generation system according to the present invention, the outputs from the respective power generation layers can be used by one load, resulting in an increase in convenience. In addition, since the power generation efficiency of each power generation layer of the photovoltaic element can be maximized, a larger power can be supplied to the load.

Furthermore, for most of the generated power of the photovoltaic element 1, a high voltage as the serial output from the two power generation layers 11 and 12 is directly boosted by the boosting converter 32. For this reason, the boost ratio of the boosting converter 32 can be made lower than that of the boosting converter of the first embodiment. Hence, the efficiency can easily be increased.

Moreover, since the boost ratio of the boosting converter 31 is relatively as low as 1 to 3, the efficiency of the boosting converter 31 can easily be increased. The power converted by the boosting converter 31 is also boosted by the boosting converter 32 on the output side. That is, the power is converted twice and supplied to the grid connected inverter 41. However, the ratio of this power is lower than that of the power directly supplied from the photovoltaic element 1 to the boosting converter 32, and the effect of loss at the time of conversion is small. In this embodiment, the boosting converter 31 uses an insulating transformer. However, since the boost ratio of the boosting converter 31 is relatively low, as described above, the efficiency can also be increased even by using the chopper scheme.

In addition, since the negative input terminals of the two boosting converters are equipotential, the control power supply generation circuit and/or control circuit can easily be shared. Hence, the cost and loss can be reduced.

[Third Embodiment]

The third embodiment according to the present invention will be described next.

Figure 7:
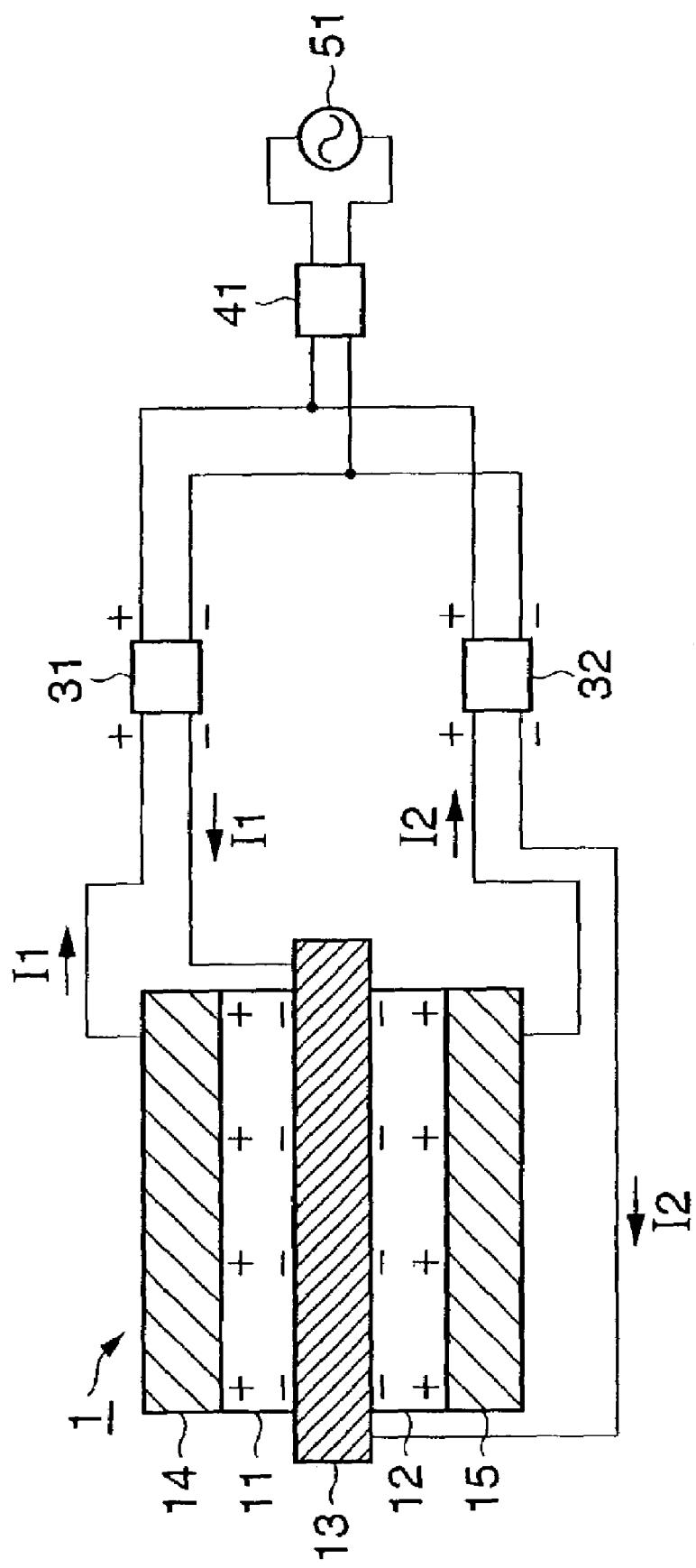
FIG. 7 is a view showing another example of the arrangement of the power generation system according to the present invention.

FIG. 7 is a view showing the arrangement of a power generation system according to the present invention. The same reference numerals as in FIG. 1 of the first embodiment denote the same parts in FIG. 7. Points different to the first embodiment will be described below.

In the power generation system shown in FIG. 7, the polarity of a photovoltaic element 1 and power generation layer 12 is opposite to the first embodiment. A power generation layer 11 and the power generation layer 12 are connected in series in a reverse direction through an intermediate electrode 13. In addition, the intermediate electrode 13 has lead-out portions on both sides and electrical connection portions on both sides of the photovoltaic element 1.

The positive input terminal of a boosting converter 31 is connected to an upper electrode 14. The positive input terminal of a boosting converter 32 is connected to a lower electrode 15. Both the negative input terminals of the boosting converters 31 and 32 are connected to the intermediate electrode 13, though they are separately connected to the electrical connection portions on both sides. As described above, the output from the power generation layer 11 is connected to the input terminal of the boosting converter 31, and the output from the power generation layer 12 is connected to the input terminal of the boosting converter 32. The outputs from the two boosting converters 31 and 32 are connected in parallel and connected to the input terminals of a grid connected inverter 41.

In the above arrangement, the current that flows from the power generation layer 11 to the intermediate electrode 13 through the boosting converter 31 and the current that flows from the power generation layer 12 to the intermediate electrode 13 through the boosting converter 32 flow in reverse directions and cancel each other in the intermediate electrode 13. The actual current flowing through the intermediate electrode 13 decreases, and the wiring loss in the intermediate electrode 13 can be reduced. The currents are maximized on both sides of the intermediate electrode 13 and become zero at a point near the center. This position is defined by the output currents of the two power generation layers 11 and 12.

With the above-described arrangement, in the power generation system according to the present invention, the outputs from the respective power generation layers can be used by one load, resulting in an increase in convenience. In addition, since the power generation efficiency of each power generation layer of the photovoltaic element can be maximized, a larger power can be supplied to the load.

Furthermore, since the negative input terminals of the two boosting converters are almost equipotential, the control power supply generation circuit and/or control circuit can easily be shared. Hence, the cost and loss can be reduced.

[Fourth Embodiment]

Figure 8:
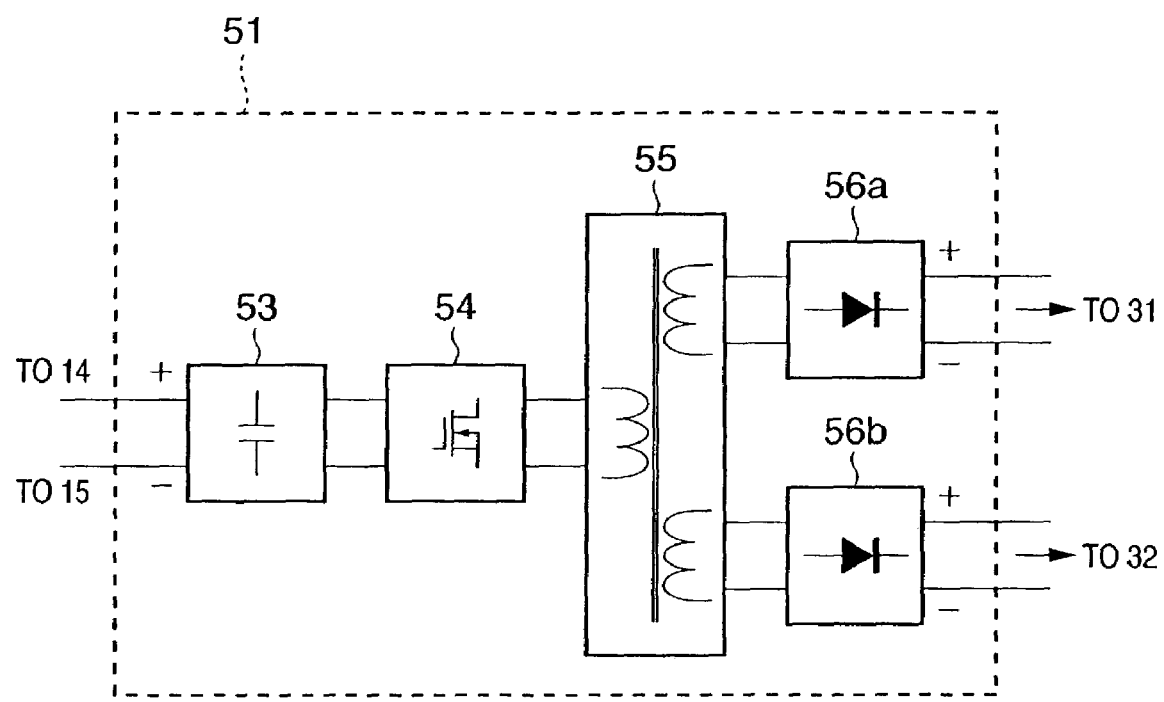
FIG. 8 is a view showing an example of a control power supply.

This embodiment is related to the control power supply generation circuit of boosting converters 31 and 32. This will be described with reference to FIG. 8.

A control power supply generation circuit 52 comprises a smoothing capacitor 53, switching means 54, transformer 55, and rectifying means 56a and 56b. The positive input terminal of the control power supply generation circuit 52 is connected to an upper electrode 14 of a photovoltaic element 1. The negative input terminal is connected to a lower electrode 15 of the photovoltaic element 1. The transformer 55 has two secondary windings which are connected to the rectifying means 56a and 56b, respectively, to supply separate control power supplies to the boosting converters 31 and 32.

In the power generation system having the control power supply generation circuit 52 with the above arrangement, the serial voltage from two power generation layers 11 and 12, which does not always equal the voltage input to each boosting converter, is input and boosted to generate the control power supply. For this reason, the boost ratio becomes low, and the loss in the control power supply can be reduced. In addition, since the control power supply generation circuit is shared by the boosting converters, the loss and cost of the control power supply generation circuit can be suppressed. Hence, the efficiency of the power generation system can be increased, and the cost can be reduced.

Figure 9:
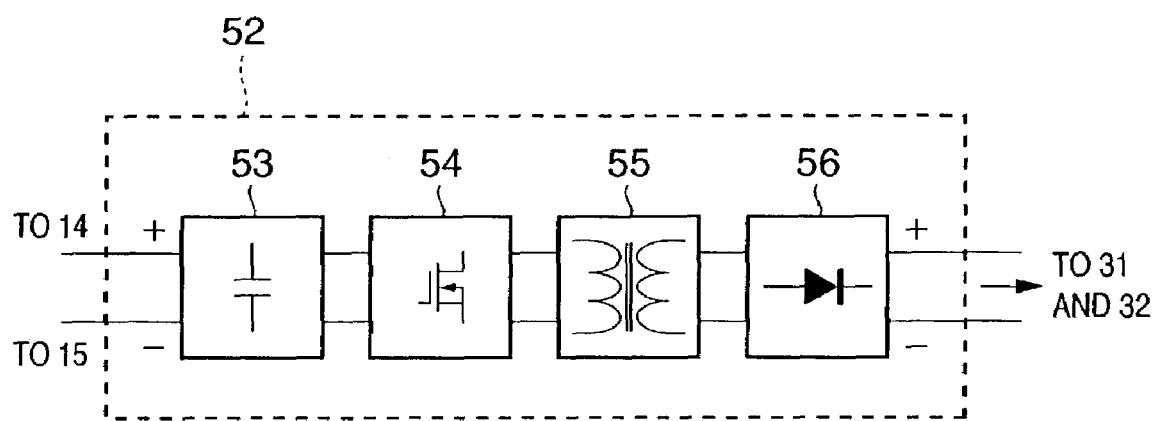
FIG. 9 is a view showing another example of the control power supply.
Figure 10:
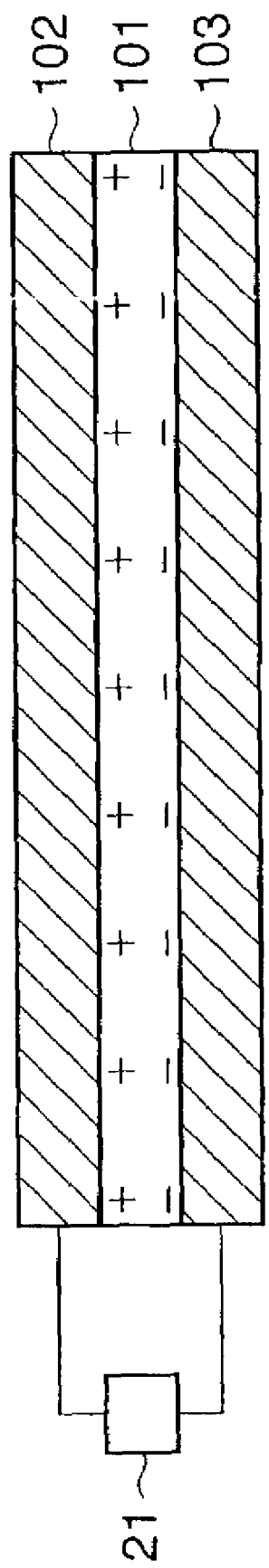
FIG. 10 is a view showing the first example of a conventional photovoltaic element.
Figure 11:
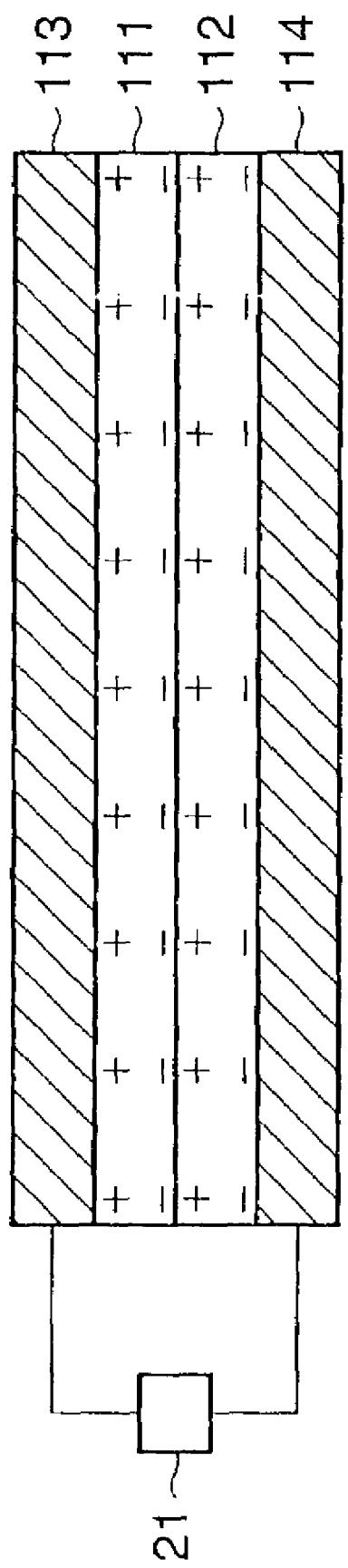
FIG. 11 is a view showing the second example of the conventional photovoltaic element.
Figure 12:
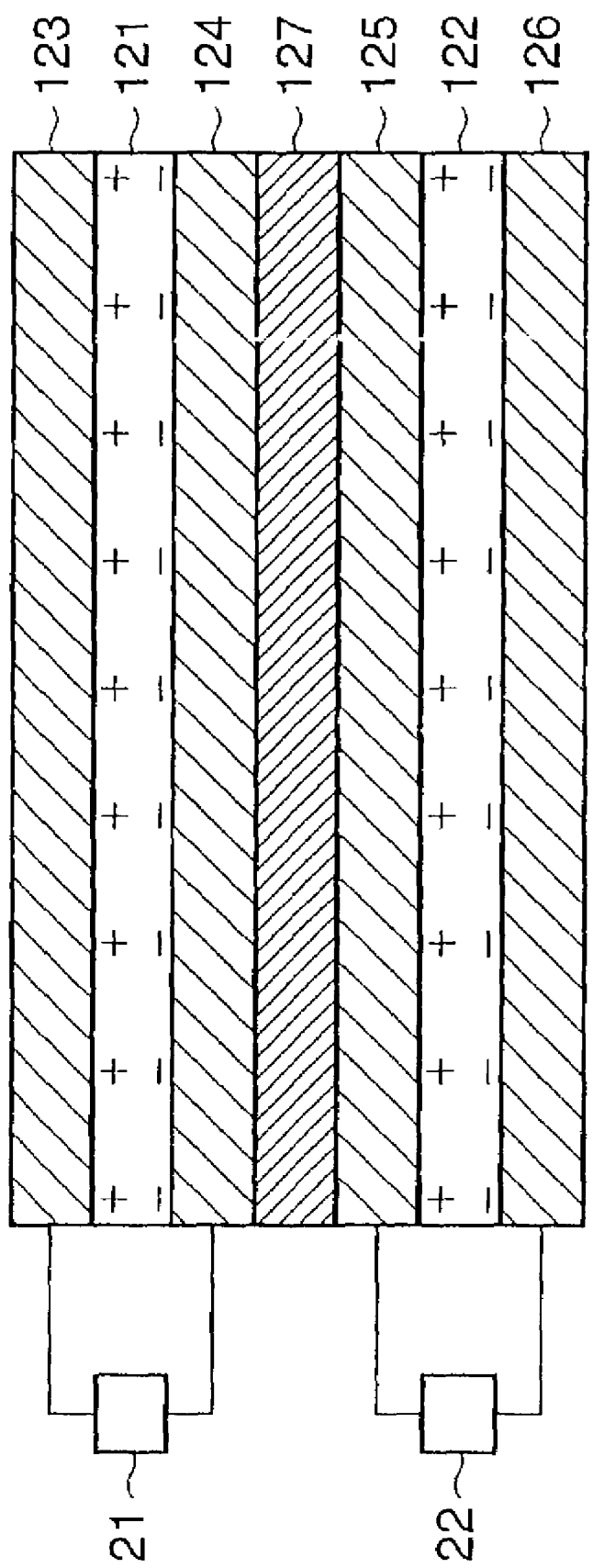
FIG. 12 is a view showing the third example of the conventional photovoltaic element.
Figure 13:
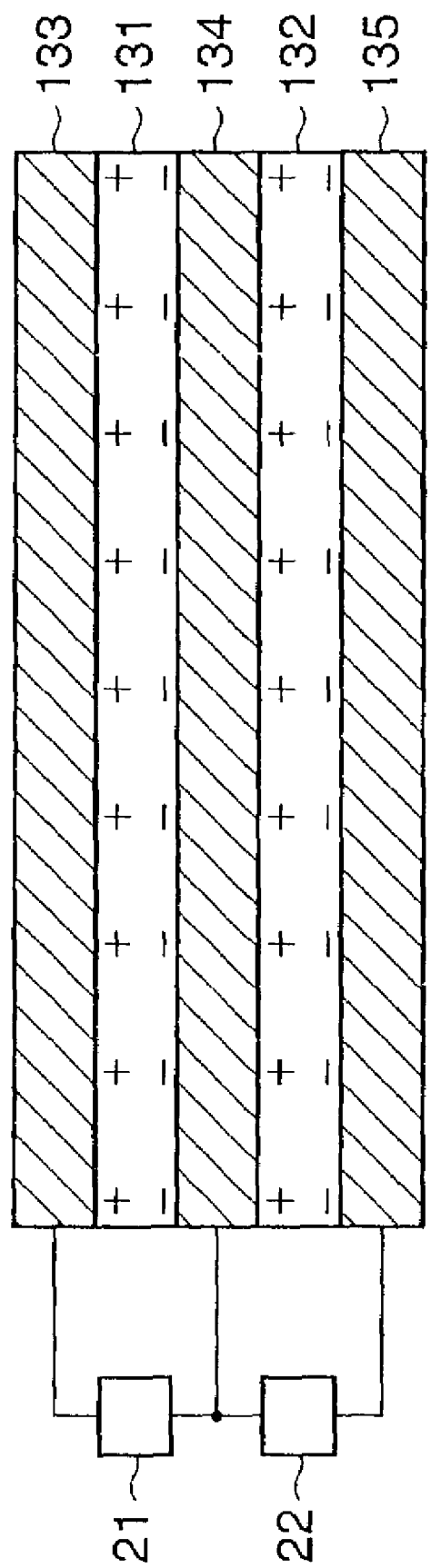
FIG. 13 is a view showing the fourth example of the conventional photovoltaic element.

Alternatively, as shown in FIG. 9, the control power supply generation circuit 52 may be designed to receive the serial voltage from the two power generation layers 11 and 12 and supply a common power supply to the boosting converters 31 and 32. In this case, the cost, loss, and size of the control power supply generation circuit 52 can be further reduced as compared to the arrangement shown in FIG. 8.

[Fifth Embodiment]

The fifth embodiment according to the present invention will be described next.

Figure 14:
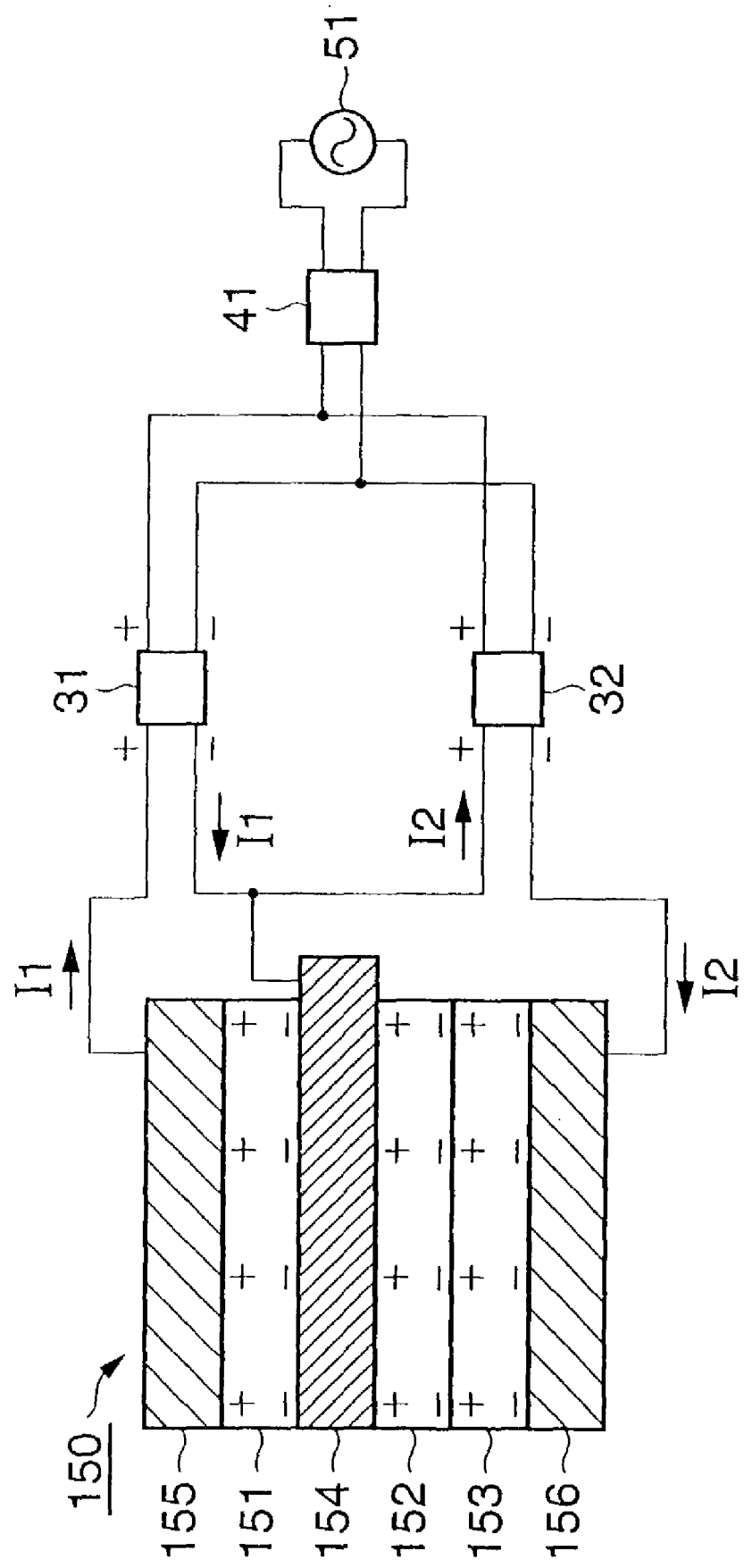
FIG. 14 is a view showing still another example of the arrangement of the power generation system according to the present invention.

FIG. 14 is a view showing the arrangement of a power generation system according to the present invention. The same reference numerals as in FIG. 1 of the first embodiment denote the same parts in FIG. 14. In this embodiment, a photovoltaic element 150 has an arrangement different from that of the photovoltaic element 1 according to the first embodiment. Points different to the first embodiment will be described below.

An explanation will be done using the schematic sectional view of the photovoltaic element 150 used in the power generation system shown in FIG. 14.

The photovoltaic element 150 is constituted by stacking an upper electrode 155, power generation layer 151, intermediate electrode 154, power generation layer 152, power generation layer 153, and lower electrode 156 sequentially from the incident light side. All the power generation layers 151, 152, and 153 are designed to have positive polarity on the surfaces on the incident light side. The power generation layers 151 and 152 are electrically connected in series through the intermediate electrode 154. The power generation layers 152 and 153 are directly electrically connected in series.

The power generation layers 152 and 153 have the same wavelength sensitivity characteristic. The power generation layer 151 has an optical wavelength sensitivity different from that of the power generation layers 152 and 153 to effectively use the optical spectrum of incident light. The power generation layers are formed to increase the sum of the outputs from the power generation layers and have different current characteristics. For example, the power generation layer 151 may be made of amorphous silicon, and the power generation layers 152 and 153 may be made of crystallite silicon.

The upper electrode 155, intermediate electrode 154, and lower electrode 156 have the same structures as those of the upper electrode 14, intermediate electrode 13, and lower electrode 15 of the first embodiment.

The output from the power generation layer 151 is fed to a boosting converter 31 as a current I1 through the upper electrode 155 and intermediate electrode 154. The serial output from the power generation layers 152 and 153 is fed to a boosting converter 32 as a current I2 through the intermediate electrode 154 and lower electrode 156.

The output from the power generation layer 151 and the serial output from the power generation layers 152 and 153 are fed to the separate boosting converters. For this reason, a so-called IV mismatch does not occur. The outputs from the respective power generation layers can be effectively used. In addition, since the power generation layer 151 and the power generation layers 152 and 153 need not have current balance, the light utilization efficiency of each power generation layer can be increased. Since the power generation layers 152 and 153 have the same optical wavelength sensitivity, current balance can relatively easily be maintained, and the light utilization efficiency can sufficiently be increased.

The power generation system having the photovoltaic element 150 has the two boosting converters 31 and 32. The output from the power generation layer 151 is connected to the input terminal of the boosting converter 31. The serial output from the power generation layers 152 and 153 is connected to the input terminal of the boosting converter 32. The outputs from the two boosting converters 31 and 32 are connected in parallel and connected to the input terminals of a grid connected inverter 41. The outputs from the grid connected inverter 41 are connected to a commercial power system 51.

In this embodiment, the arrangement is simplified using a switching element driving circuit capable of driving a switching element at a fixed duty, as in the first embodiment. When the boosting converters 31 and 32 operate at fixed duties D1 and D2, and the power generation layers 151, 152, and 153 are at maximum power voltages Vpm1, Vpm2, and Vpm3, respectively, the maximum power voltage of the serial output from the power generation layers 152 and 153 is Vpm2+Vpm3 because the power generation layers 152 and 153 have current balance. Turn ratios N1 and N2 of transformers 35 are designed such that the boosting converters 31 and 32 output the same output voltage Vol. More specifically, it is designed such that the output voltage Vol=Vpm1×D1×N1=(Vpm2+Vpm3)×D2×N2. With this design, different maximum power voltages, i.e., the output from the power generation layer 151 and the serial output from the power generation layers 152 and 153 are mapped to become the same maximum power voltage on the output side of the boosting converter.

As in the first embodiment, the grid connected inverter 41 controls the outputs from the two boosting converters 31 and 32 by maximum power point tracking control. Accordingly, each of the power generation layers 151, 152, and 153 generates a power at a corresponding maximum power point. Hence, the power generation efficiency of each power generation layer can be maximized.

In addition, when the power generation layers 152 and 153 are connected in series to output a power, the output current from the power generation layers 152 and 153 decreases, and the output voltage becomes high. Hence, the conducting loss in the photovoltaic element 150 and boosting converter 32 can be reduced. This effect is large because in the photovoltaic element, the voltage of one power generation layer is as low as about 1 V.

Furthermore, the voltage input to the boosting converter 32 becomes high, and the boost ratio of the boosting converter 32 can be lowered. Hence, the efficiency of the boosting converter 32 can easily be increased.

With the above arrangement, in the power generation system according to the present invention, the outputs from the respective power generation layers can be used by one load, resulting in an increase in convenience. In addition, since the power generation efficiency of each power generation layer of the photovoltaic element can be maximized, a larger power can be supplied to the load.

Furthermore, as the output from the photovoltaic element to the boosting converter, the current is small, and the voltage is high. Hence, the conducting loss of the photovoltaic element and boosting converter can be reduced, and the efficiency can be increased.

In the control power supply generation circuit (not shown) of the boosting converters 31 and 32, when the serial output from the three power generation layers 151, 152, and 153 is input from the upper electrode 155 and lower electrode 156 at both ends of the photovoltaic element 150, the voltage input to the control power supply generation circuit becomes high, the boost ratio is reduced, and the loss in the control power supply generation circuit can be decreased. In an oscillation circuit for generating a control power supply in the control power supply generation circuit, the operable circuit arrangement, process, and operation condition are limited at a low voltage as an output from one power generation layer or a serial output from two power generation layers. However, the limitations on the operable circuit arrangement, process, and operation condition are relaxed at a higher input voltage as a serial output from three power generation layers. Hence, the arrangement becomes inexpensive, and stable operation can be ensured.

In this embodiment, the power generation layers 152 and 153 have the same wavelength sensitivity characteristic. However, they may have different wavelength sensitivity characteristics as long as current balance can be obtained. As examples of the power generation layers, the power generation layer 151 is made of amorphous silicon, and the power generation layers 152 and 153 are made of crystallite silicon. However, the present invention is not limited to this, and various materials can be used.

[Sixth Embodiment]

The sixth embodiment according to the present invention will be described next.

Figure 15:
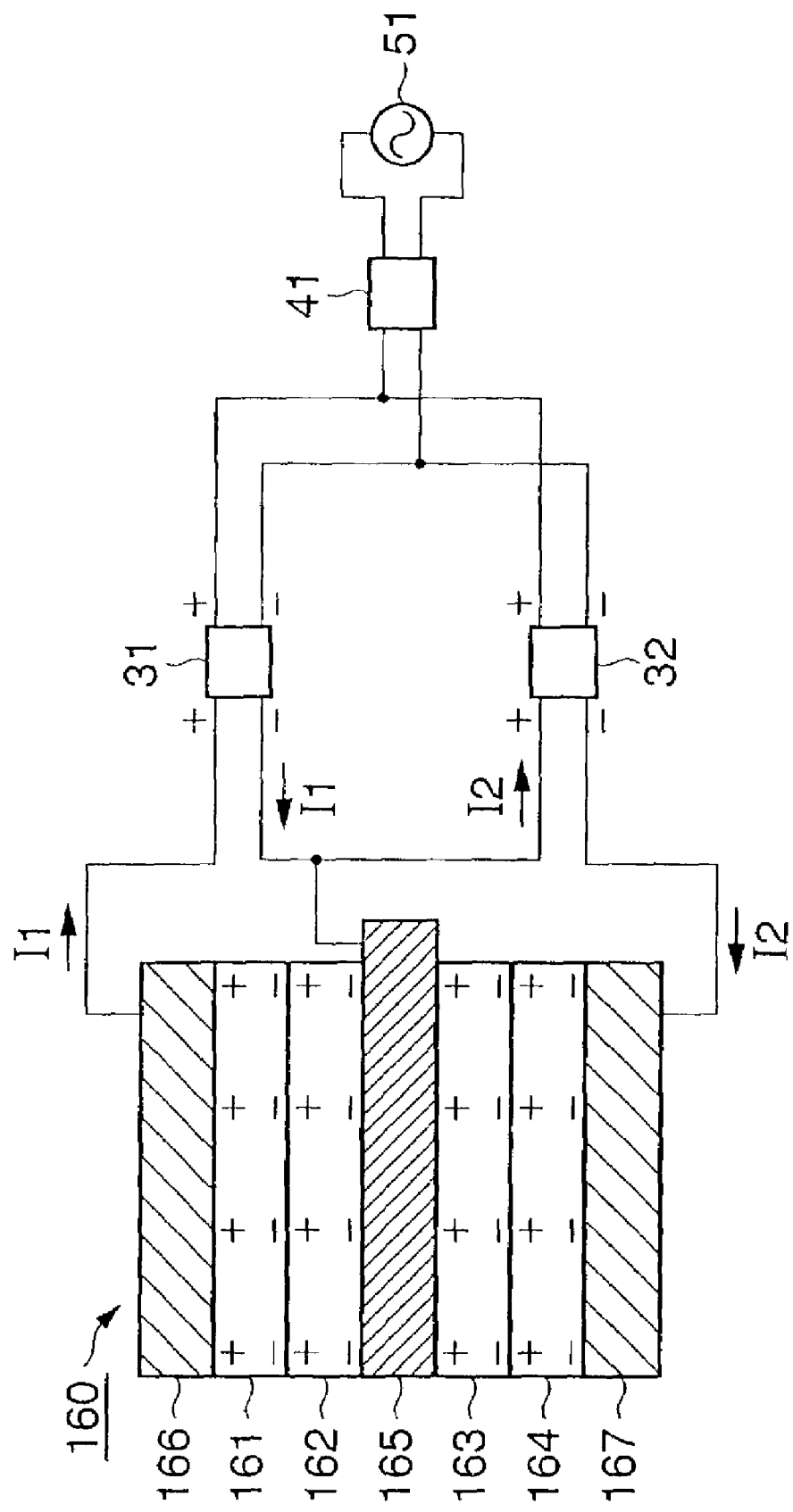
FIG. 15 is a view showing another example of the arrangement of the power generation system according to the present invention.

FIG. 15 is a view showing the arrangement of a power generation system according to the present invention. The same reference numerals as in FIG. 1 of the first embodiment or FIG. 14 of the fifth embodiment denote the same parts in FIG. 15. In this embodiment, a photovoltaic element 160 has an arrangement different from that of the photovoltaic element 1 according to the first embodiment or the photovoltaic element 150 according to the fifth embodiment. Points different to the first and fifth embodiments will be described below.

An explanation will be done using the schematic sectional view of the photovoltaic element 160 used in the power generation system shown in FIG. 15.

The photovoltaic element 160 is constituted by stacking an upper electrode 166, power generation layer 161, power generation layer 162, intermediate electrode 165, power generation layer 163, power generation layer 164, and lower electrode 167 sequentially from the incident light side. All the power generation layers 161, 162, 163, and 164 are designed to have a positive polarity on the surfaces on the incident light side. The power generation layers 162 and 163 are electrically connected in series through the intermediate electrode 165. The power generation layers 161 and 162, and the power generation layers 163 and 164 are directly electrically connected in series.

The power generation layers 161 and 162 have the same wavelength sensitivity characteristic. The power generation layers 163 and 164 have the same wavelength sensitivity characteristic. The power generation layers 161 and 162, and the power generation layers 163 and 164 have different optical wavelength sensitivities to effectively use the optical spectrum of incident light. The power generation layers are formed to increase the sum of the outputs from the power generation layers and have different current characteristics. For example, the power generation layers 161 and 62 may be made of amorphous silicon, and the power generation layers 163 and 164 may be made of crystallite silicon.

The upper electrode 166, intermediate electrode 165, and lower electrode 167 have the same structures as those of the upper electrode 14, intermediate electrode 13, and lower electrode 15 of the first embodiment.

The serial output from the power generation layers 161 and 162 is fed to a boosting converter 31 as a current I1 through the upper electrode 166 and intermediate electrode 165. The serial output from the power generation layers 163 and 164 is fed to a boosting converter 32 as a current I2 through the intermediate electrode 165 and lower electrode 167.

The serial output from the power generation layers 161 and 162 and the serial output from the power generation layers 163 and 164 are fed to the separate boosting converters. For this reason, so-called IV mismatch does not occur. The outputs from the respective power generation layers can be effectively used. In addition, since the power generation layers 161 and 162, and the power generation layers 163 and 164 need not have current balance, the light utilization efficiency of each power generation layer can be increased. Since the power generation layers 161 and 162, and the, power generation layers 163 and 164 have the same optical wavelength sensitivity, current balance can relatively easily be maintained, and the light utilization efficiency can sufficiently be increased.

The power generation system having the photovoltaic element 160 has the two boosting converters 31 and 32. The serial output from the power generation layers 161 and 162 is connected to the input terminal of the boosting converter 31. The serial output from the power generation layers 163 and 164 is connected to the input terminal of the boosting converter 32. The outputs from the two boosting converters 31 and 32 are connected in parallel and connected to the input terminals of a grid connected inverter 41. The outputs from the grid connected inverter 41 are connected to a commercial power system 51.

In this embodiment, the arrangement is simplified using a switching element driving circuit capable of driving a switching element at a fixed duty, as in the first and fifth embodiments. When the boosting converters 31 and 32 operate at fixed duties D1 and D2, and the power generation layers 161, 162, 163, and 164 are at maximum power voltages Vpm1, Vpm2, Vpm3, and Vpm4, respectively, the maximum power voltage of the power generation layers 161 and 162 is Vpm1+Vpm2 because the power generation layers 161 and 162 have current balance. In addition, the maximum power voltage of the serial output of the power generation layers 163 and 164 is Vpm3+Vpm4 because the power generation layers 163 and 164 have current balance. Turn ratios N1 and N2 of transformers 35 are designed such that the boosting converters 31 and 32 output the same output voltage Vol. More specifically, it is designed such that the output voltage Vol=(Vpm1+Vpm2)×D1×N1=(Vpm3+Vpm4)×D2×N2. With this design, the maximum power voltage Vpm1+Vpm2 of the serial output from the power generation layers 161 and 162 and the maximum power voltage Vpm3+Vpm4 of the serial output from the power generation layers 163 and 164 are mapped to become the same maximum power voltage on the output side of the boosting converter.

As in the first and fifth embodiments, the grid connected inverter 41 controls the outputs from the two boosting converters 31 and 32 by maximum power point tracking control. Accordingly, each of the power generation layers 161, 162, 163, and 164 generates a power at a corresponding maximum power point. Hence, the power generation efficiency of each power generation layer can be maximized.

In the fifth embodiment, one set of serial output of two power generation layers is prepared. In the sixth embodiment, two sets of serial outputs of two power generation layers are prepared. The effect of reducing the conducting loss in the photovoltaic element 160 and two boosting converters can be further increased by decreasing the current and increasing the voltage of the photovoltaic element.

In addition, since the input voltages to both the boosting converters become high, the efficiency can further be increased by reducing the boost ratio of the boosting converter.

In the control power supply generation circuit (not shown) of the boosting converters 31 and 32, when the serial outputs from the four power generation layers 161, 162, 163, and 164 are input from the upper electrode 166 and lower electrode 167 at both ends of the photovoltaic element 160, the voltage input to the control power supply generation circuit becomes high, the boost ratio is reduced, and the loss in the control power supply generation circuit can be decreased. In an oscillation circuit for generating a control power supply in the control power supply generation circuit, the operable circuit arrangement, process, and operation condition are limited at a low voltage as a serial output from two power generation layers. However, the limitations on the operable circuit arrangement, process, and operation condition are relaxed at a higher input voltage as serial outputs from four power generation layers. Hence, the arrangement becomes inexpensive, and stable operation can be ensured. Some or all of the control power supplies may be designed to directly input the serially output voltages from the four power generation layers. In this case, the arrangement becomes more inexpensive, and the loss in the control power supply generation circuit can be reduced.

In this embodiment, the power generation layers 161 and 162 or the power generation layers 163 and 164 have the same wavelength sensitivity characteristic. However, the power generation layers 161 and 162 and/or the power generation layers 163 and 164 may have different wavelength sensitivity characteristics as long as current balance can be obtained. As examples of the power generation layers, the power generation layers 161 and 162 are made of amorphous silicon, and the power generation layers 163 and 164 are made of crystallite silicon. However, the present invention is not limited to this, and various materials can be used.

The extraction structures of the photovoltaic elements described above in the embodiments are not limited to one power generation layer+one power generation layer, one power generation layer+two power generation layers, and two power generation layers+two power generation layers. Various changes and modifications can be made to, e.g., two power generation layers+three power generation layers or one power generation layer+two power generation layers+two power generation layers.

As is apparent, many different embodiments of the present invention can be made without departing from the spirit and scope thereof, so it is to be understood that the invention is not limited to the specific embodiments thereof except as defined in the appended claims.

What is claimed is:

1. A power generation system comprising:
a photovoltaic element comprising two power generation layers, an intermediate electrode which is inserted between the two power generation layers and includes a transparent conductive layer, an upper electrode which includes an upper transparent conductive layer and is formed on an incident-light-side surface of one of the two power generation layers, and a lower electrode which is formed on a surface of the other one of the two power generation layers on an opposite side to the incident light side, wherein the two power generation layers are electrically connected in series through the intermediate electrode, and said photovoltaic element is configured to be able to extract a generated power from the upper electrode, the intermediate electrode, and the lower electrode;

a first power conversion device, wherein an output from said first power conversion device is obtained by receiving and power-converting an output from one of the two power generation layers and is connected in parallel with a serial output from the two power generation layers;

a second power conversion device in which the output from said first power conversion device is received, power-converted, and fed to a load; and a control power supply generation circuit which receives and boosts a serial output from the two power generation layers, which have polarities connected in series in a forward direction, to supply a control power supply of said first and second power conversion devices.

* * * * *

UNITED STATES PATENT AND TRADEMARK OFFICE
CERTIFICATE OF CORRECTION

| | | |
|---|---|---|
| PATENT NO. | : 7,126,053 B2 | Page 1 of 2 |
| APPLICATION NO. | : 10/463790 | |
| DATED | : October 24, 2006 | |
| INVENTOR(S) | : Seiji Kurokami et al. | |

It is certified that error appears in the above-identified patent and that said Letters Patent is hereby corrected as shown below:

COLUMN 2
Line 4, "layers, 121" should read --layers 121--.

COLUMN 5
Line 1, "Still" should read --still--; and
Line 34, "in to" should read --into--.

COLUMN 11
Line 21, "allow" should read --alloy--;
Line 31, "may used" should read --may be used--;
Line 60, "polystylene," should read --polystyrene,--; and
Line 65, "insulting" should read --insulating--.

COLUMN 13
Line 3, "insulting" should read --insulating--;
Line 7, "insulting" should read --insulating--;
Line 23, "insulting" should read --insulating--; and
Line 47, "reduce and" should read --reduce the--.

COLUMN 18
Line 18, "Vol" should read --Vo1--; and
Line 23, "Vol" should read --Vo1--.

COLUMN 19
Line 23, "Vol" should read --Vo1--; and
Line 30, "Vol" should read --Vo1--.

COLUMN 22
Line 51, "Vol." should read --Vo1.--; and
Line 53, "Vol" should read --Vo1--.

UNITED STATES PATENT AND TRADEMARK OFFICE
CERTIFICATE OF CORRECTION

PATENT NO. : 7,126,053 B2
APPLICATION NO. : 10/463790
DATED : October 24, 2006
INVENTOR(S) : Seiji Kurokami et al.

It is certified that error appears in the above-identified patent and that said Letters Patent is hereby corrected as shown below:

COLUMN 25
Line 9, "Vol." should read --Vol.--; and
Line 10, "Vol" should read --Vol--.

Signed and Sealed this

Seventeenth Day of April, 2007

JON W. DUDAS
*Director of the United States Patent and Trademark Office*